United States Patent
Kim et al.

(10) Patent No.: US 11,636,892 B2
(45) Date of Patent: Apr. 25, 2023

(54) METHOD OF COUNTING NUMBER OF CELLS IN NONVOLATILE MEMORY DEVICE AND NONVOLATILE MEMORY DEVICE WITH CELL COUNTER PERFORMING THE SAME

(71) Applicant: Samsung Electronics Co., Ltd., Suwon-si (KR)

(72) Inventors: Minseok Kim, Hwaseong-si (KR); Hyunggon Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 34 days.

(21) Appl. No.: 17/346,171

(22) Filed: Jun. 11, 2021

(65) Prior Publication Data
US 2022/0093160 A1 Mar. 24, 2022

(30) Foreign Application Priority Data
Sep. 23, 2020 (KR) .................. 10-2020-0122979

(51) Int. Cl.
*G11C 16/08* (2006.01)
*G11C 11/4091* (2006.01)
(Continued)

(52) U.S. Cl.
CPC ...... *G11C 11/4091* (2013.01); *G11C 11/4074* (2013.01); *G11C 16/0483* (2013.01);
(Continued)

(58) Field of Classification Search
CPC ............ G11C 16/3404; G11C 16/3418; G11C 16/3454; G11C 16/3459; G11C 16/349;
(Continued)

(56) References Cited

U.S. PATENT DOCUMENTS

| 6,642,873 B1 | 11/2003 | Kuang |
| 6,703,960 B2 | 3/2004 | Kressin |

(Continued)

FOREIGN PATENT DOCUMENTS

KR 1020040039703 A 5/2004

*Primary Examiner* — Mushfique Siddique
(74) *Attorney, Agent, or Firm* — Muir Patent Law, PLLC

(57) ABSTRACT

In a method of counting the number of memory cells in a nonvolatile memory device, a measurement range and a plurality of measurement intervals of a measurement window for a cell counting operation are set to a first range and a plurality of first intervals, respectively. The plurality of measurement intervals are included in the measurement range. A first sensing operation is performed on first memory cells included in a first region of a memory cell array based on the measurement window. A first shifting operation for shifting the measurement window is performed while a width of the measurement range and a width of each of the plurality of measurement intervals are maintained. A second sensing operation is performed on the first memory cells based on the measurement window shifted by the first shifting operation. A final count value for the first memory cells is obtained based on a result of the first sensing operation and a result of the second sensing operation.

18 Claims, 35 Drawing Sheets

(51) Int. Cl.
*G11C 11/4074* (2006.01)
*G11C 16/34* (2006.01)
*G11C 16/04* (2006.01)
*G11C 11/4076* (2006.01)
*G11C 11/4099* (2006.01)
*G11C 16/26* (2006.01)

(52) U.S. Cl.
CPC ........ *G11C 16/3404* (2013.01); *G11C 16/349* (2013.01); *G11C 16/3418* (2013.01); *G11C 16/3454* (2013.01); *G11C 16/3459* (2013.01); *G11C 16/3495* (2013.01); *G11C 11/4076* (2013.01); *G11C 11/4099* (2013.01); *G11C 16/26* (2013.01)

(58) Field of Classification Search
CPC ... G11C 16/3495; G11C 11/4076; G11C 5/14; G11C 29/021; G11C 29/028
See application file for complete search history.

(56) References Cited

U.S. PATENT DOCUMENTS

| | | | |
|---|---|---|---|
| 7,696,917 | B2 | 4/2010 | Matsuura et al. |
| 8,681,033 | B2 | 3/2014 | Marukame et al. |
| 10,629,279 | B2 | 4/2020 | Yun et al. |
| 2002/0169603 | A1 | 11/2002 | Sculley |
| 2017/0133087 | A1* | 5/2017 | Park ........................ G11C 16/10 |
| 2019/0147964 | A1* | 5/2019 | Yun .................... G11C 16/3404 365/185.22 |
| 2019/0206497 | A1* | 7/2019 | Lim ....................... G11C 16/00 |
| 2021/0005265 | A1* | 1/2021 | Lee ........................ G11C 16/08 |
| 2021/0407598 | A1* | 12/2021 | Goode ................... G11C 16/28 |

* cited by examiner

FIG. 10B

| OUT<0:9> | MEASUREMENT INTERVAL | COUNT VALUE |
|---|---|---|
| 1000000000 | - | 0 |
| 1100000000 | MI11 | 6 |
| 1110000000 | MI21 | 18 |
| 1111000000 | MI31 | 30 |
| 1111100000 | MI41 | 42 |
| 1111110000 | MI51 | 54 |
| 1111111000 | MI61 | 66 |
| 1111111100 | MI71 | 78 |
| 1111111110 | MI81 | 90 |
| 1111111111 | MI91 | 102 |

FIG. 14B

| OUT<0:9> | MEASUREMENT INTERVAL | COUNT VALUE |
|---|---|---|
| 1000000000 | - | 0 |
| 1100000000 | MI12 | 0 |
| 1110000000 | MI22 | 12 |
| 1111000000 | MI32 | 24 |
| 1111100000 | MI42 | 36 |
| 1111110000 | MI52 | 48 |
| 1111111000 | MI62 | 60 |
| 1111111100 | MI72 | 72 |
| 1111111110 | MI82 | 84 |
| 1111111111 | MI92 | 96 |

FIG. 20B

| OUT<0:9> | MEASUREMENT INTERVAL | COUNT VALUE |
|---|---|---|
| 1000000000 | - | 0 |
| 1100000000 | MI13 | 12 |
| 1110000000 | MI23 | 36 |
| 1111000000 | MI33 | 60 |
| 1111100000 | MI43 | 84 |
| 1111110000 | MI53 | 108 |
| 1111111000 | MI63 | 132 |
| 1111111100 | MI73 | 156 |
| 1111111110 | MI83 | 180 |
| 1111111111 | MI93 | 204 |

FIG. 21B

| OUT<0:9> | MEASUREMENT INTERVAL | COUNT VALUE |
|---|---|---|
| 1000000000 | - | 0 |
| 1100000000 | MI14 | 0 |
| 1110000000 | MI24 | 24 |
| 1111000000 | MI34 | 48 |
| 1111100000 | MI44 | 72 |
| 1111110000 | MI54 | 96 |
| 1111111000 | MI64 | 120 |
| 1111111100 | MI74 | 144 |
| 1111111110 | MI84 | 168 |
| 1111111111 | MI94 | 192 |

FIG. 24B

| OUT<0:9> | MEASUREMENT INTERVAL | COUNT VALUE |
|---|---|---|
| 1000000000 | - | 0 |
| 1100000000 | MI15 | 0 |
| 1110000000 | MI25 | 20 |
| 1111000000 | MI35 | 44 |
| 1111100000 | MI45 | 68 |
| 1111110000 | MI55 | 92 |
| 1111111000 | MI65 | 116 |
| 1111111100 | MI75 | 140 |
| 1111111110 | MI85 | 164 |
| 1111111111 | MI95 | 188 |

FIG. 25B

| OUT<0:9> | MEASUREMENT INTERVAL | COUNT VALUE |
|---|---|---|
| 1000000000 | - | 0 |
| 1100000000 | MI16 | 4 |
| 1110000000 | MI26 | 28 |
| 1111000000 | MI36 | 52 |
| 1111100000 | MI46 | 76 |
| 1111110000 | MI56 | 100 |
| 1111111000 | MI66 | 124 |
| 1111111100 | MI76 | 148 |
| 1111111110 | MI86 | 172 |
| 1111111111 | MI96 | 196 |

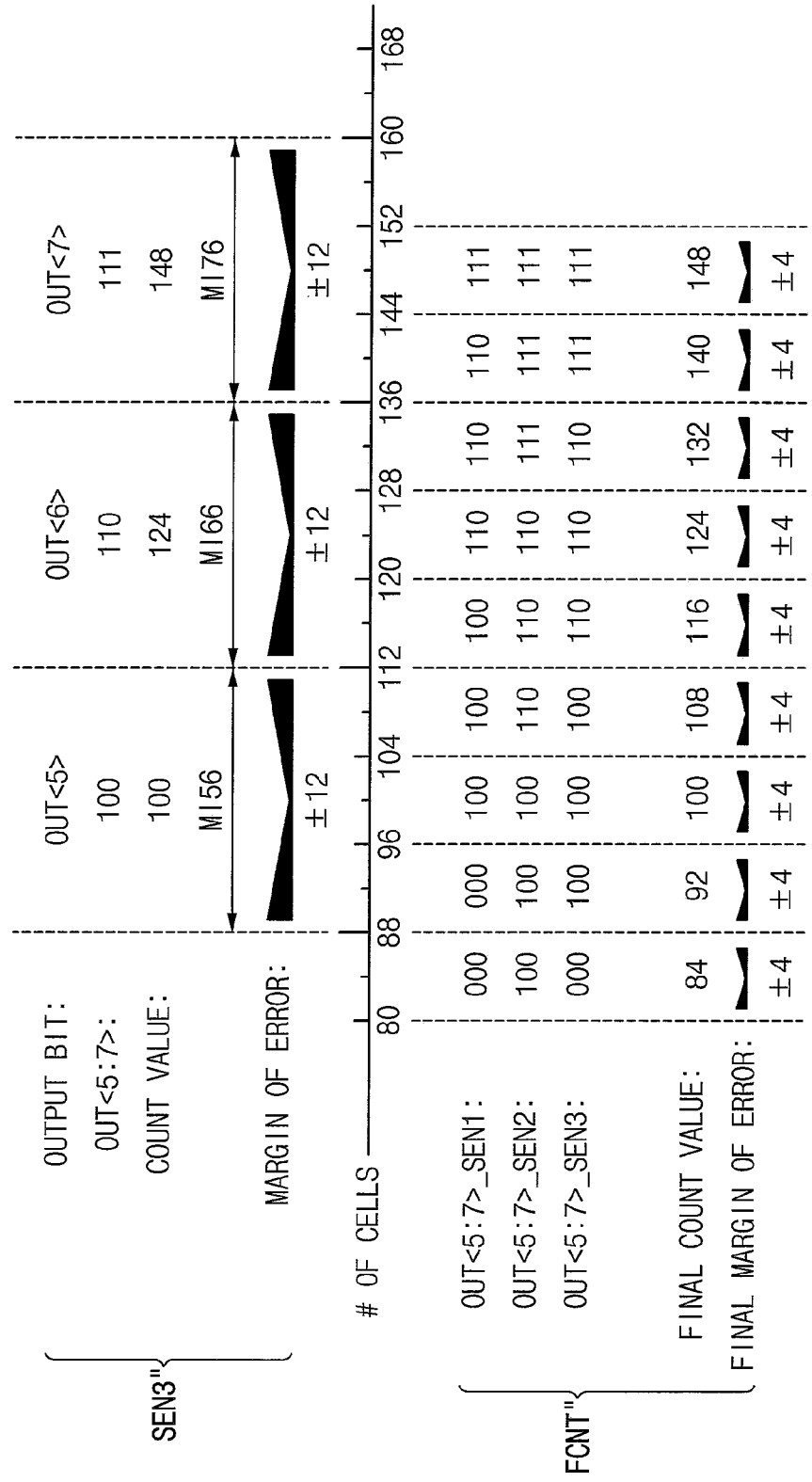

METHOD OF COUNTING NUMBER OF CELLS IN NONVOLATILE MEMORY DEVICE AND NONVOLATILE MEMORY DEVICE WITH CELL COUNTER PERFORMING THE SAME

CROSS-REFERENCE TO RELATED APPLICATION

This application claims priority under 35 USC § 119 to Korean Patent Application No. 10-2020-0122979, filed on Sep. 23, 2020 in the Korean Intellectual Property Office (KIPO), the contents of which are herein incorporated by reference in their entirety.

BACKGROUND

1. Technical Field

Example embodiments relate generally to semiconductor integrated circuits, and more particularly to methods of counting the number of cells in nonvolatile memory devices, and nonvolatile memory devices performing the methods of counting the number of cells.

2. Description of the Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. When program and/or erase operations are performed on the nonvolatile memory device, it may be required to count the number of memory cells that satisfies specific conditions.

SUMMARY

Example embodiments of the present disclosure provide a method of counting the number of memory cells in a nonvolatile memory device capable of efficiently counting the number of memory cells in a relatively short time.

Example embodiments of the present disclosure provide a nonvolatile memory device that performs the method of counting the number of memory cells.

According to example embodiments, in a method of counting the number of memory cells in a memory cell array of a nonvolatile memory device, a measurement range and a plurality of measurement intervals of a measurement window for a cell counting operation are set to a first range and a plurality of first intervals, respectively. The plurality of measurement intervals are included in the measurement range. A first sensing operation is performed on first memory cells included in a first region of the memory cell array based on the measurement window. A first shifting operation for shifting the measurement window is performed while a width of the measurement range and a width of each of the plurality of measurement intervals are maintained. A second sensing operation is performed on the first memory cells based on the measurement window shifted by the first shifting operation. A final count value for the first memory cells is obtained based on a result of the first sensing operation and a result of the second sensing operation. The measurement range and each of the plurality of measurement intervals represent a number of memory cells associated with the final count value.

According to example embodiments, a nonvolatile memory device includes a memory cell array and a control circuit. The memory cell array includes a plurality of memory cells. The control circuit sets a measurement range and a plurality of measurement intervals of a measurement window for a cell counting operation to a first range and a plurality of first intervals, respectively, performs a first sensing operation on first memory cells included in a first region of the memory cell array based on the measurement window, performs a first shifting operation for shifting the measurement window while a width of the measurement range and a width of each of the plurality of measurement intervals are maintained, performs a second sensing operation on the first memory cells based on the measurement window shifted by the first shifting operation, and obtains a final count value for the first memory cells based on a result of the first sensing operation and a result of the second sensing operation. The plurality of measurement intervals are included in the measurement range.

According to example embodiments, in a method of counting the number of memory cells in memory cell array of a nonvolatile memory device, a measurement range and a plurality of measurement intervals of a measurement window for a cell counting operation are set to a first range and a plurality of first intervals, respectively. The plurality of measurement intervals are included in the measurement range. A first sensing operation is performed on first memory cells included in a first region of the memory cell array based on the measurement window having the first range and the plurality of first intervals. A first shifting operation for shifting the measurement window is performed while a width of the measurement range and a width of each of the plurality of measurement intervals are maintained. The measurement range is set to a second range having a width equal to that of the first range by the first shifting operation. The plurality of measurement intervals are set to a plurality of second intervals having a width equal to that of each of the plurality of first intervals by the first shifting operation. A second sensing operation is performed on the first memory cells based on the measurement window shifted by the first shifting operation and having the second range and the plurality of second intervals. A final count value for the first memory cells is obtained based on a result of the first sensing operation and a result of the second sensing operation. When performing the first sensing operation, a first sensing current is obtained from the first memory cells. A first count value is obtained by comparing the first sensing current with a reference current. The first count value is stored. When performing the second sensing operation, a second sensing current is obtained from the first memory cells. A second count value is obtained by comparing the second sensing current with the reference current. The second count value is stored. When obtaining the final count value, the final count value is calculated based on the first count value and the second count value.

In the method of counting the number of memory cells and the nonvolatile memory device according to example embodiments, two or more sensing operations may be performed by changing the measurement position of the measurement window on time, and the final count value may be obtained by combining the results of the sensing operations. It may be required a relatively short time to change only the measurement position of the measurement window while the measurement range and the measurement intervals of the measurement window are maintained, and thus the cell count value with a relatively improved resolution and/or a relatively improved capacity may be obtained by performing an additional sensing operation with a relatively short time. For such operation, turn-on and turn-off of transistors may be controlled based on a plurality of enable signals without changing an analog signal.

BRIEF DESCRIPTION OF THE DRAWINGS

Illustrative, non-limiting example embodiments will be more clearly understood from the following detailed description taken in conjunction with the accompanying drawings.

FIGS. 10A and 10B are diagrams for describing an operation of FIG. 9 according to example embodiments.

FIGS. 14A and 14B are diagrams for describing an operation of FIG. 13 according to example embodiments.

FIGS. 20A and 20B are diagrams for describing an operation of FIG. 19 according to example embodiments.

FIGS. 21A and 21B are diagrams for describing an example of performing a first shifting operation in FIG. 18 according to example embodiments.

FIGS. 24A and 24B are diagrams for describing an example of performing a first shifting operation in FIG. 23 according to example embodiments.

FIGS. 25A and 25B are diagrams for describing an example of performing a second shifting operation in FIG. 23 according to example embodiments.

FIGS. 26A and 26B are diagrams for describing an example of obtaining a final count value in FIG. 23 according to example embodiments.

DETAILED DESCRIPTION OF THE EMBODIMENTS

Figure 1:
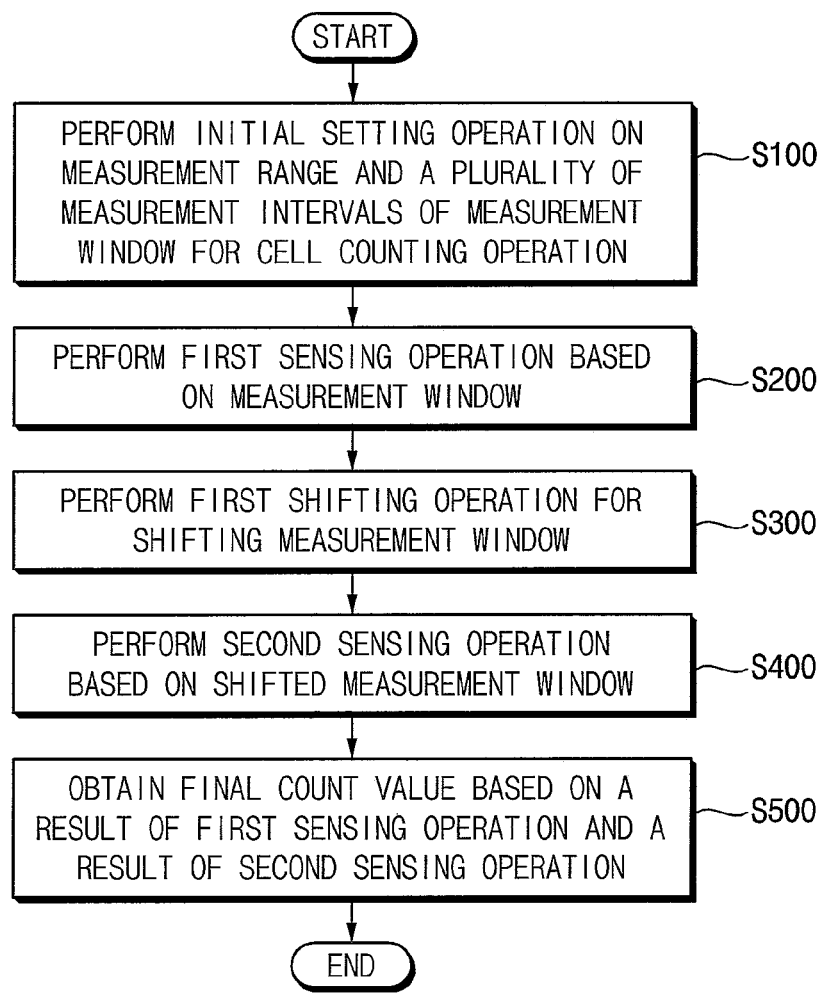
FIG. 1 is a flowchart illustrating a method of counting the number of memory cells in a nonvolatile memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of counting the number of memory cells in a nonvolatile memory device according to example embodiments.

Referring to FIG. 1, a method of counting the number of memory cells according to example embodiments is performed by a nonvolatile memory device that includes a memory cell array and a control circuit. The memory cell array includes a plurality of memory cells, and the control circuit controls an operation of the memory cell array. For example, the control circuit may include a cell counter that performs a cell counting operation. Configurations of the nonvolatile memory device and elements included therein will be described in detail with reference to FIGS. 2 through 6.

In the method of counting the number of memory cells in the nonvolatile memory device according to example embodiments, an initial setting operation is performed on a measurement range of a measurement window for the cell counting operation and a plurality of measurement intervals of the measurement window for the cell counting operation (step S100). The plurality of measurement intervals are included in the measurement range. The plurality of measurement intervals may have the same width (or the same length). For example, when the initial setting operation is performed, the measurement range and the plurality of measurement intervals may be set to a first range and a plurality of first intervals, respectively. The first range and the first interval may be a predetermined range and a predetermined interval, respectively. The cell counting operation may be referred to as a mass bit counting operation.

In some example embodiments, the measurement range and the plurality of measurement intervals may represent the number of memory cells. For example, the measurement range may represent a range of the number of memory cells (e.g., a cell count value) that can be counted by performing a single sensing operation, and a width of the measurement range may represent a capacity of the cell counting operation. Each of the plurality of measurement intervals may represent an accuracy or precision of the cell count value obtained by performing a single sensing operation, and a width of each measurement interval may represent a resolution of the cell counting operation. For example, the measurement range and the plurality of measurement intervals may represent or correspond to a performance of the cell counting operation.

A first sensing operation is performed on first memory cells included in a first region of the memory cell array based on the measurement window (step S200). For example, during the first sensing operation, the measurement range and the plurality of measurement intervals may have the first range and the plurality of first intervals, respectively. A first digital value and/or a first count value may be obtained as a result of the first sensing operation.

A first shifting operation for shifting the measurement window is performed (step S300). The first shifting operation may be performed by shifting or moving only a position of the measurement window while the width of the measurement range and the widths of the plurality of measurement intervals are maintained. For example, when or after the first shifting operation is performed, the measurement range and the plurality of measurement intervals may be set to have a second range and a plurality of second intervals, respectively. A width of the second range may be equal to a width of the first range, and a width of each of the plurality of second intervals may be equal to a width of each of the plurality of first intervals.

A second sensing operation is performed on the first memory cells based on the measurement window shifted by the first shifting operation (step S400). For example, during the second sensing operation, the measurement range and the plurality of measurement intervals may have the second range and the plurality of second intervals, respectively. A second digital value and/or a second count value may be obtained as a result of the second sensing operation.

A final count value for the first memory cells is obtained based on a result (e.g., the first digital value and/or the first count value) of the first sensing operation and a result (e.g., the second digital value and/or the second count value) of the second sensing operation (step S500).

In the method of counting the number of memory cells in the nonvolatile memory device according to example embodiments, two sensing operations may be performed by changing the measurement position of the measurement window on time, and the final count value may be obtained by combining the results of the two sensing operations. It may be required a relatively short time to change only the measurement position of the measurement window while the measurement range and the measurement intervals of the measurement window are maintained, and thus the cell count value with a relatively improved resolution and a fixed capacity may be obtained by performing an additional sensing operation with a relatively short time. For such operation, turn-on and turn-off of transistors may be controlled based on a plurality of enable signals without changing an analog signal.

The method of counting the number of memory cells in the nonvolatile memory device according to example embodiments may be performed based on a command received from an external device (e.g., a memory controller) or may be performed without the command. For example, the method of counting the number of memory cells according to example embodiments may be performed when the cell counting operation is used during program/erase/read operations and/or when only the cell counting operation is used. For example, the above-described operations may be performed based on an external command or may be internally performed in the nonvolatile memory device by itself without the external command.

Figure 2:
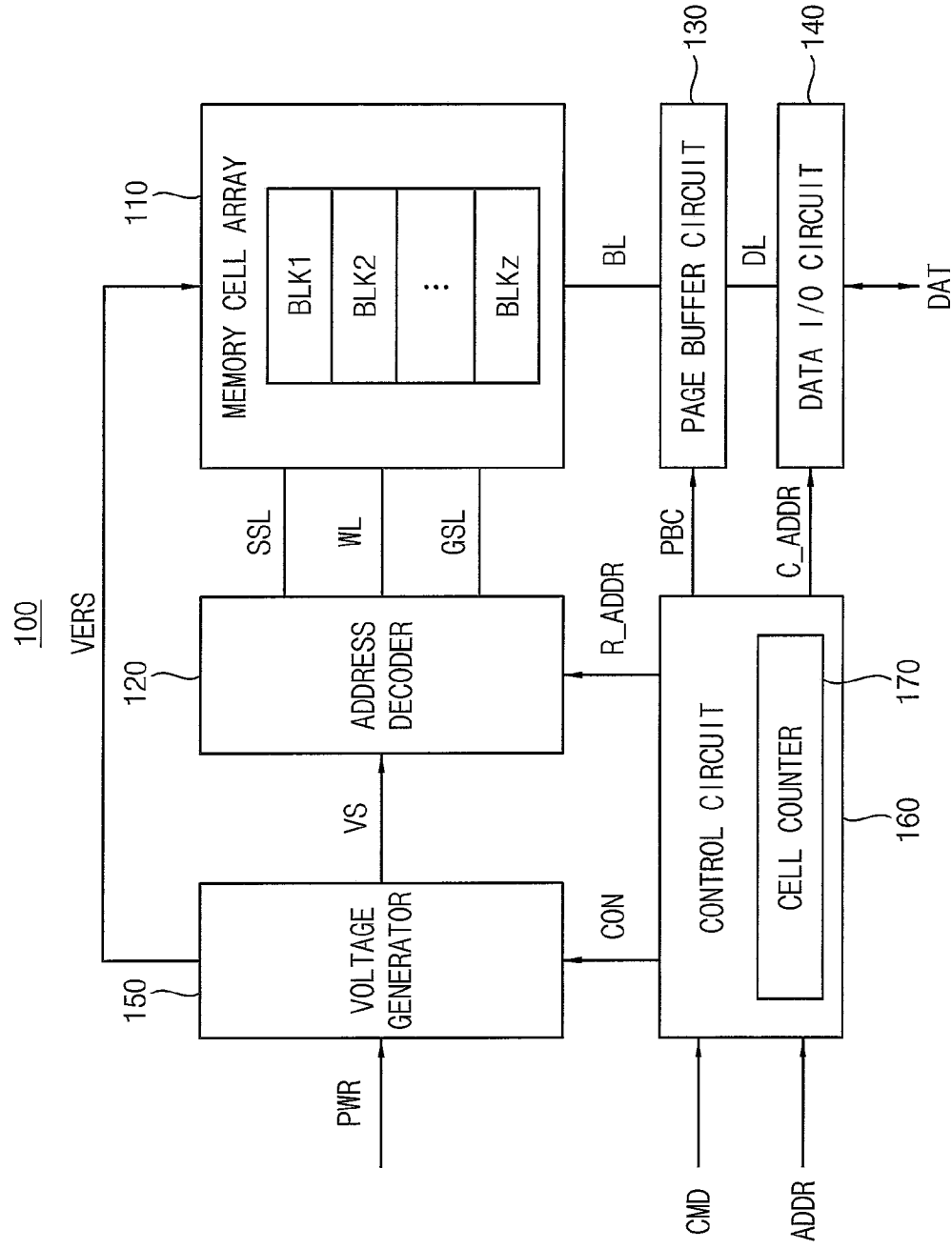
FIG. 2 is a block diagram illustrating a nonvolatile memory device according to example embodiments.

FIG. 2 is a block diagram illustrating a nonvolatile memory device according to example embodiments.

Referring to FIG. 2, a nonvolatile memory device 100 includes a memory cell array 110, an address decoder 120, a page buffer circuit 130, a data input/output (I/O) circuit 140, a voltage generator 150 and a control circuit 160.

The memory cell array 110 is connected to the address decoder 120 via a plurality of string selection lines SSL, a plurality of wordlines WL and a plurality of ground selection lines GSL. The memory cell array 110 is further connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, . . . , and BLKz each of which includes memory cells. In addition, each of the plurality of memory blocks BLK1, BLK2, . . . , and BLKz may be divided into a plurality of pages.

In some example embodiments, as will be described with reference to FIGS. 3 and 4, the memory cell array 110 may be a three-dimensional memory cell array, which is formed on a substrate in a three-dimensional structure (or a vertical structure). In this example, the memory cell array 110 may include a plurality of cell strings (e.g., a plurality of vertical NAND strings) that are vertically oriented such that at least one memory cell is located over another memory cell.

The control circuit 160 receives a command CMD and an address ADDR from an outside (e.g., from a memory controller), and control erasure, program and read operations of the nonvolatile memory device 100 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and a data recover read operation.

For example, the control circuit 160 may generate control signals CON, which are used for controlling the voltage generator 150, and may generate page buffer control signals PBC for controlling the page buffer circuit 130, based on the command CMD, and may generate a row address R_ADDR and a column address C_ADDR based on the address ADDR. The control circuit 160 may provide the row address R_ADDR to the address decoder 120 and may provide the column address C_ADDR to the data I/O circuit 140.

The control circuit 160 may include a cell counter 170 that performs the method of counting the number of memory cells according to example embodiments described with reference to FIG. 1. For example, the cell counter 170 may set a measurement range and a plurality of measurement intervals of a measurement window for a cell counting operation to a first range and a plurality of first intervals, respectively, may perform a first sensing operation on the memory cells included in the memory cell array 110 based on the measurement window, may perform a first shift operation for shifting the measurement window while a width of the measurement range and widths of the plurality of measurement intervals are maintained, may perform a second sensing operation on the memory cells based on the shifted measurement window, and may obtain a final count value for the memory cells based on a result of the first sensing operation and a result of the second sensing operation. In addition, the cell counter 170 may perform a method of counting the number of memory cells according to example embodiments which will be described with reference to FIGS. 18 and 23. The cell counter 170 may be referred to as a mass bit counter (MBC). In some example embodiments, the cell counter 170 may be disposed or located outside the control circuit 160.

The address decoder 120 may be connected to the memory cell array 110 via the plurality of string selection lines SSL, the plurality of wordlines WL and the plurality of ground selection lines GSL.

For example, in the data erase/write/read operations, the address decoder 120 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate voltages VS that are used for an operation of the nonvolatile memory device 100 based on a power PWR and the control signals CON. The voltages VS may be applied to the plurality of string selection lines SSL, the plurality of wordlines WL and the plurality of ground selection lines GSL via the address decoder 120. In addition, the voltage generator 150 may generate an erase voltage VERS that is used for the data erase operation based on the power PWR and the control signals CON. The erase voltage VERS may be applied to the memory cell array 110 directly or via the bitline BL.

For example, during the erase operation, the voltage generator 150 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 120. In addition, during the erase verification operation, the voltage generator 150 may apply an erase verification voltage simultaneously to all wordlines of the memory block or sequentially to the wordlines one by one.

For example, during the program or write operation, the voltage generator 150 may apply a program voltage to the selected wordline and may apply a program pass voltage to the unselected wordlines via the address decoder 120. In addition, during the program verification operation, the voltage generator 150 may apply a program verification voltage to the selected wordline and may apply a verification pass voltage to the unselected wordlines via the address decoder 120.

In addition, during the normal read operation, the voltage generator 150 may apply a read voltage to the selected wordline and may apply a read pass voltage to the unselected wordlines via the address decoder 120. During the data recover read operation, the voltage generator 150 may apply the read voltage to a wordline adjacent to the selected wordline and may apply a recover read voltage to the selected wordline via the address decoder 120.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. For example, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from the outside of the nonvolatile memory device 100 to the memory cell array 110 via the page buffer circuit 130 or may provide the data DAT from the memory cell array 110 to the outside of the nonvolatile memory device 100, based on the column address C_ADDR.

Figure 3:
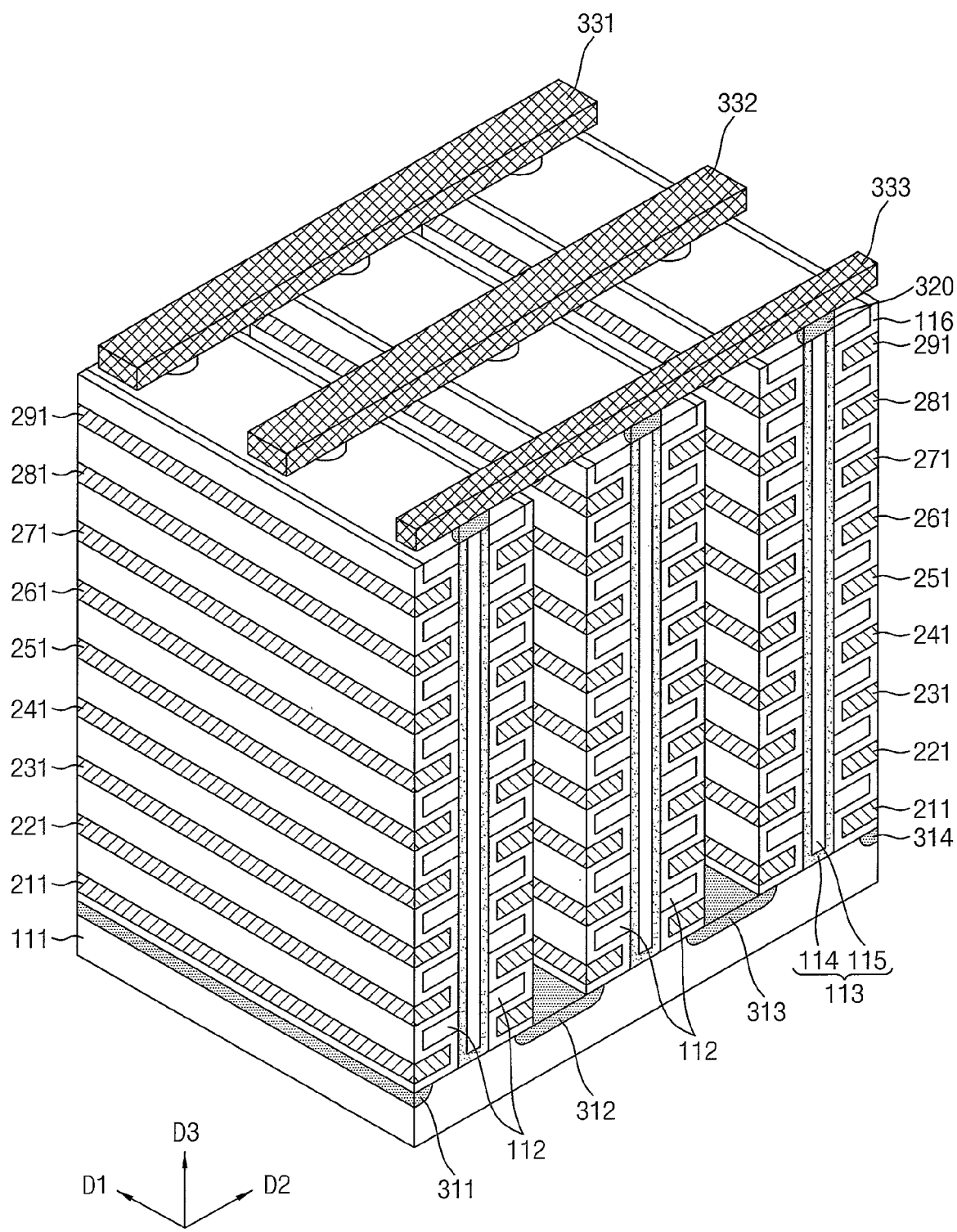
FIG. 3 is a perspective view illustrating an example of a memory block included in a memory cell array of the nonvolatile memory device of FIG. 2.

FIG. 3 is a perspective view illustrating an example of a memory block included in a memory cell array of the nonvolatile memory device of FIG. 2.

Referring to FIG. 3, a memory block BLKi includes a plurality of cell strings (e.g., a plurality of vertical NAND strings) which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an embodiment, the substrate 111 may have a p-type well (or a p-type pocket well). However, the conductive type of the substrate 111 is not limited to p-type.

First to fourth doping regions 311, 312, 313 and 314 arranged along the second direction D2 are provided in/on the substrate 111. Each of the first to fourth doping regions 311 to 314 may have a second type of charge carrier impurity (e.g., a second conductivity type) different from the first type of the substrate 111. In one embodiment of the invention, the first to fourth doping regions 311 to 314 may have n-type.

However, the conductive type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrate the insulation materials 112 to contact the substrate 111.

In some example embodiments, each pillar 113 may include a plurality of materials. For example, a channel layer 114 of each pillar 113 may include a silicon material having a first conductivity type. For example, the channel layer 114 of each pillar 113 may include a silicon material having the same conductivity type as the substrate 111. In one embodiment of the invention, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 is not be provided on the top-most surfaces of the insulation materials 112 in the third direction D3. In this example, the ground selection lines GSL (e.g., 211) are the lowermost ones of the stack of first conductive materials 211 to 291 and the string selection lines SSL (e.g., 291) are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of the invention the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. A plurality of pillars 113 are provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity different from the first type of charge carrier impurity. For example, the drain regions 320 may include silicon materials doped with an n-type dopant. In one embodiment of the invention, the drain regions 320 may include n-type silicon materials. However, the drain regions 320 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 320 in a corresponding region. The drain regions 320 and the second conductive material 333 extending along the second direction D2 may be connected through each contact plug. Each contact plug may be, for example, a conductive plug formed of a conductive material such as a metal. The second conductive materials 331 to 333 may include metal materials. In some example embodiments, the second conductive materials 331 to 333 may include conductive materials such as a polysilicon.

In the example of FIG. 3, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 4:
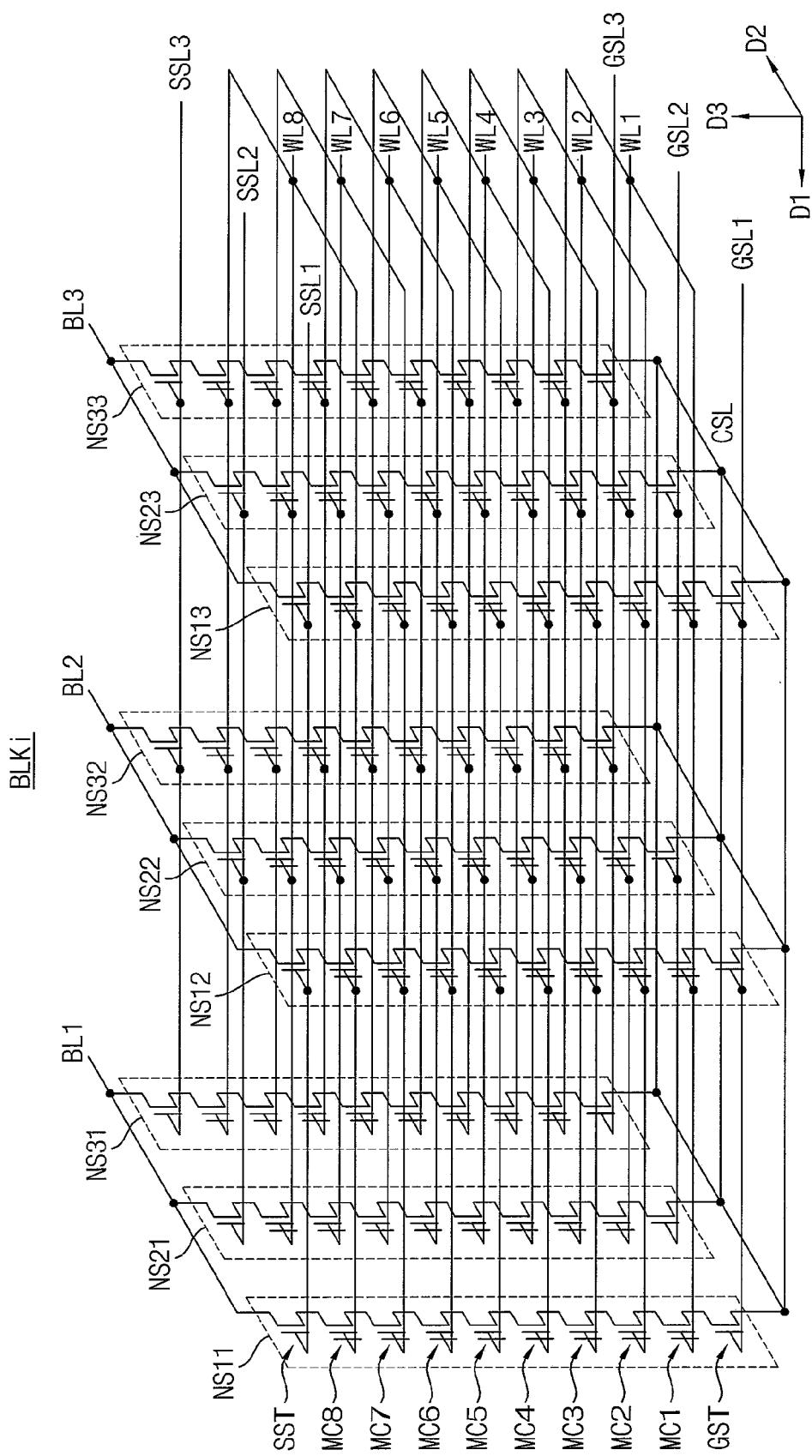
FIG. 4 is a circuit diagram illustrating an equivalent circuit of the memory block described with reference to FIG. 3.

FIG. 4 is a circuit diagram illustrating an equivalent circuit of the memory block described with reference to FIG. 3.

A memory block BLKi of FIG. 4 may be formed on a substrate in a three-dimensional structure (or a vertical structure). For example, a plurality of NAND strings included in the memory block BLKi may be formed in a direction perpendicular to the substrate.

Referring to FIG. 4, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 3, and the common source line CSL may be formed by interconnecting the first to fourth doping regions 311 to 314 in FIG. 3.

Each string selection transistor SST may be connected to a corresponding string selection line (one of string selection lines SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of ground selection lines GSL1, GSL2 and GSL3). Each string selection transistor SST may be connected to a corresponding bitline (e.g., one of the bitlines BL1 to BL3), and each ground selection transistor GST may be connected to the common source line CSL. In the example of FIG. 4, some of the string selection transistors SST are connected to the same bitline (e.g., one of the bitlines BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of cell strings.

In FIG. 4, the memory block BLKi is illustrated to be connected to eight wordlines WL1 to WL8 and three bitlines BL1 to BL3, and each of the NAND strings NS11 to NS33 is illustrated to include eight memory cells MC1 to MC8. However, the invention is not limited thereto. In some example embodiments, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 5:
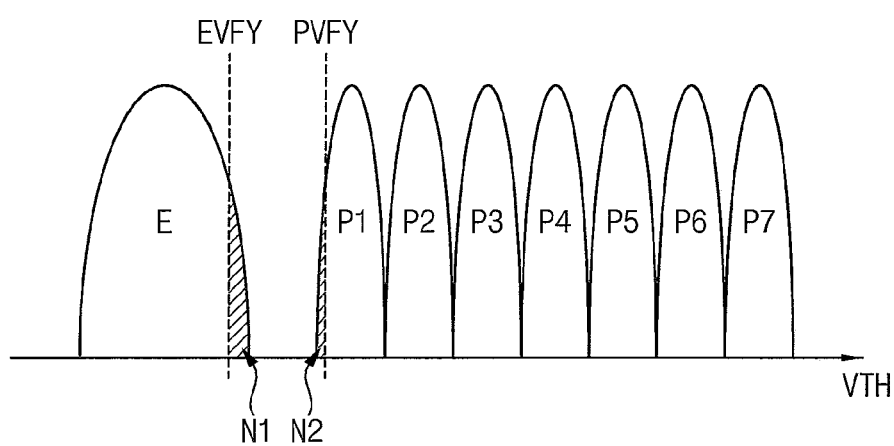
FIG. 5 is a diagram illustrating a distribution of threshold voltages of memory cells included in a memory cell array of the nonvolatile memory device of FIG. 2.

FIG. 5 is a diagram illustrating a distribution of threshold voltages of memory cells included in a memory cell array of the nonvolatile memory device of FIG. 2.

Referring to FIG. 5, the memory cells included in the memory cell array 110 may have an erase state E and program states P1, P2, P3, P4, P5, P6 and P7. Although FIG. 5 illustrates an example where the memory cells are triple-level cells (TLCs), the invention is not limited thereto, and the memory cells may be one of various types of memory cells such as quad-level cells, etc.

In some example embodiments, an erase loop may be performed on a first memory block included in the memory cell array 110. As described above, the erase loop may include an erase operation and an erase verification operation. For example, the erase operation may represent an operation of forming a distribution of threshold voltages of memory cells included in the first memory block into the erase state E, and the erase verification operation may represent an operation of determining or checking whether the erase operation is successful. For example, during the erase verification operation, the number (or quantity) N1 of memory cells having a threshold voltage higher than an erase verification voltage VEVFY may be counted, and it may be determined that the erase operation is successful when the number N1 is less than a first reference number. For example, the method of counting the number of memory cells according to example embodiments may be used to count the number N1.

In other example embodiments, a program loop may be performed on a first page included in the memory cell array 110. As described above, the program loop may include a program operation and a program verification operation. For example, the program operation may represent an operation of forming a distribution of threshold voltages of memory cells included in the first page into the program states P1, P2, P3, P4, P5, P6 and P7, and the program verification operation may represent an operation of determining or checking whether the program operation is successful. For example, during the program verification operation, the number (or quantity) N2 of memory cells having a threshold voltage lower than a program verification voltage VPVFY may be counted, and it may be determined that the program operation is successful when the number N2 is less than a second reference number. For example, the method of counting the number of memory cells according to example embodiments may be used to count the number N2.

However, the invention is not limited thereto, and the method of counting the number of memory cells according to example embodiments may be used during a read operation or various other operations, and/or may be used to improve or enhance the operating characteristics of the nonvolatile memory device. For example, the method of counting the number of memory cells according to example embodiments may be used to obtain accurate and/or more cell count values at once, and/or may be used to obtain an accurate cell count value while performing a defensive code and to efficiently recover data based on the cell count value.

Figure 6:
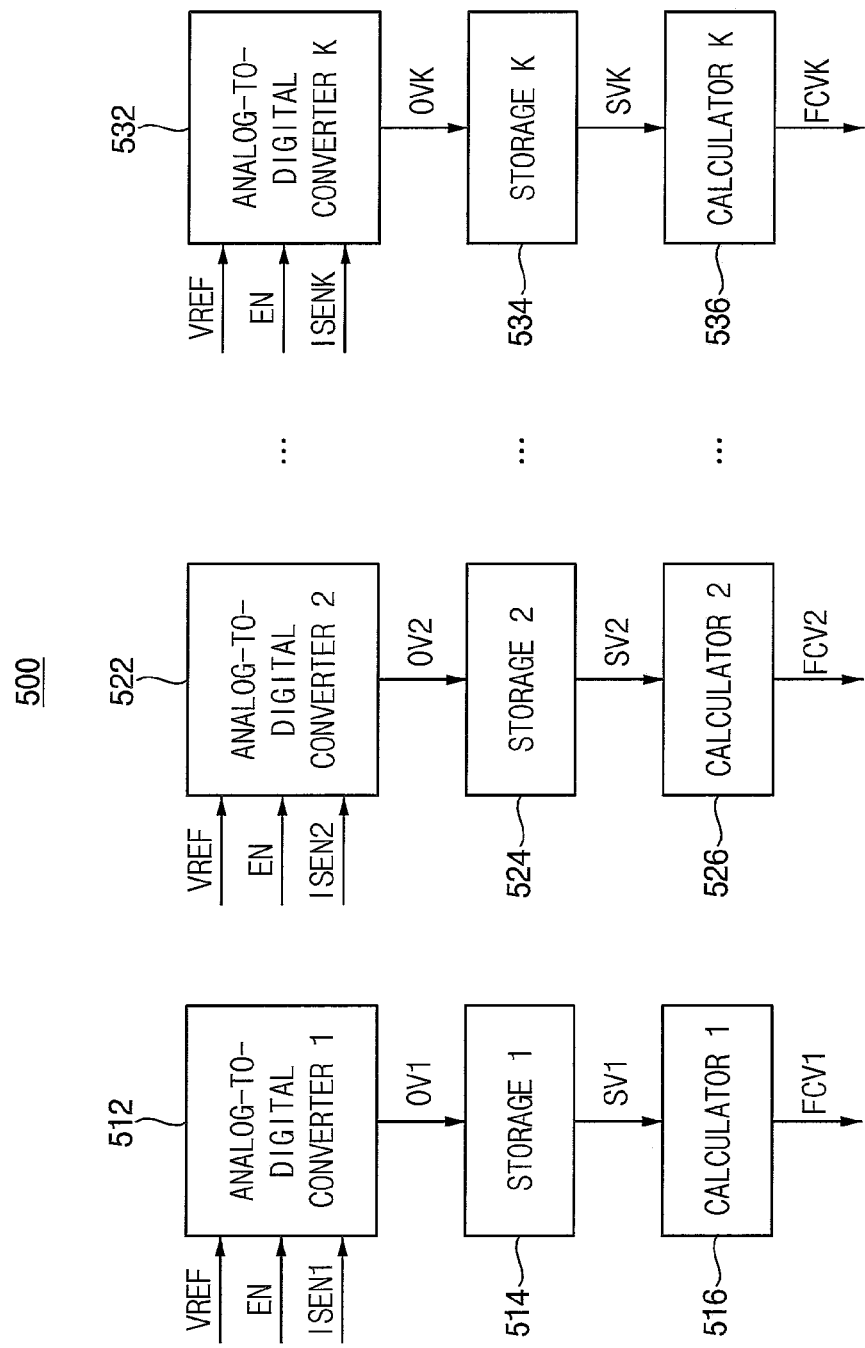
FIG. 6 is a block diagram illustrating an example of a cell counter included in the nonvolatile memory device of FIG. 2 according to example embodiments.

FIG. 6 is a block diagram illustrating an example of a cell counter included in the nonvolatile memory device of FIG. 2 according to example embodiments.

Referring to FIG. 6, a cell counter 500 may include a plurality of counting circuits.

Each of the plurality of counting circuits may include a respective one of a plurality of analog-to-digital converters 512, 522 and 532, a respective one of a plurality of storages 514, 524 and 534, and a respective one of a plurality of calculators 516, 526 and 536. In an example embodiment, one counting circuit may include one analog-to-digital converter, one storage and one calculator.

Each of the plurality of counting circuits may correspond to one region that is a portion of the memory cell array 110, and may perform a cell counting operation on the one region. For example, the one region may correspond to a storage space of about 4 KB.

Based on a sensing current ISEN1 that is obtained from first memory cells included in a first region of the memory cell array 110, a reference voltage VREF and a plurality of enable signals EN, the analog-to-digital converter 512 may perform an operation of setting a measurement window, a sensing operation and an operation of shifting the measurement window, which are used for the cell counting operation, on the first memory cells. The storage 514 may store a result OV1 of the sensing operation for the first memory cells. The calculator 516 may generate a final count value FCV1 for the first memory cells based on a value SV1 stored in the storage 514. For example, the analog-to-digital converter 512 and the storage 514 may perform steps S100, S200, S300 and S400 in FIG. 1, and the calculator 516 may perform step S500 in FIG. 1.

Similarly, based on a sensing current ISEN2 that is obtained from second memory cells included in a second region of the memory cell array 110, the reference voltage VREF and the plurality of enable signals EN, the analog-to-digital converter 522 may perform an operation of setting a measurement window, a sensing operation and an operation of shifting the measurement window on the second memory cells. The storage 524 may store a result OV2 of the sensing operation for the second memory cells. The calculator 526 may generate a final count value FCV2 for the second memory cells based on a value SV2 stored in the storage 524. Based on a sensing current ISENK that is obtained from K-th memory cells (where K is a natural number greater than or equal to three) included in a K-th region of the memory cell array 110, the reference voltage VREF and the plurality of enable signals EN, the analog-to-digital converter 532 may perform an operation of setting a measurement window, a sensing operation and an operation of shifting the measurement window on the K-th memory cells. The storage 534 may store a result OVK of the sensing operation for the K-th memory cells. The calculator 536 may generate a final count value FCVK for the K-th memory cells based on a value SVK stored in the storage 534.

If the plurality of memory cells are NAND flash memory cells, each memory cell may include a charge storage layer (or a charge trapping layer). Each memory cell may have a first state or a second state depending on the number of charges stored in the charge storage layer. For example, when the number of charges stored in the charge storage layer is greater than a reference number (e.g., when a sufficient number of charges are stored in the charge storage layer), each memory cell may have the first state, and a current less than a reference current may flow through each memory cell. When the number of charges stored in the charge storage layer is less than or equal to the reference number (e.g., when no charges are stored in the charge storage layer), each memory cell may have the second state, and a current greater than or equal to the reference current may flow through each memory cell. The memory cell having the first state may be referred to as an upper state cell or an off cell, and the memory cell having the second state may be referred to as a lower state cell or an on cell. The number of off-cells and/or the number of on-cells may be obtained based on sensing currents obtained from the plurality of memory cells. Since a relatively large number of memory cells may be counted by performing a single sensing operation, such operation may be referred to as a mass bit counting operation.

Figure 7A:
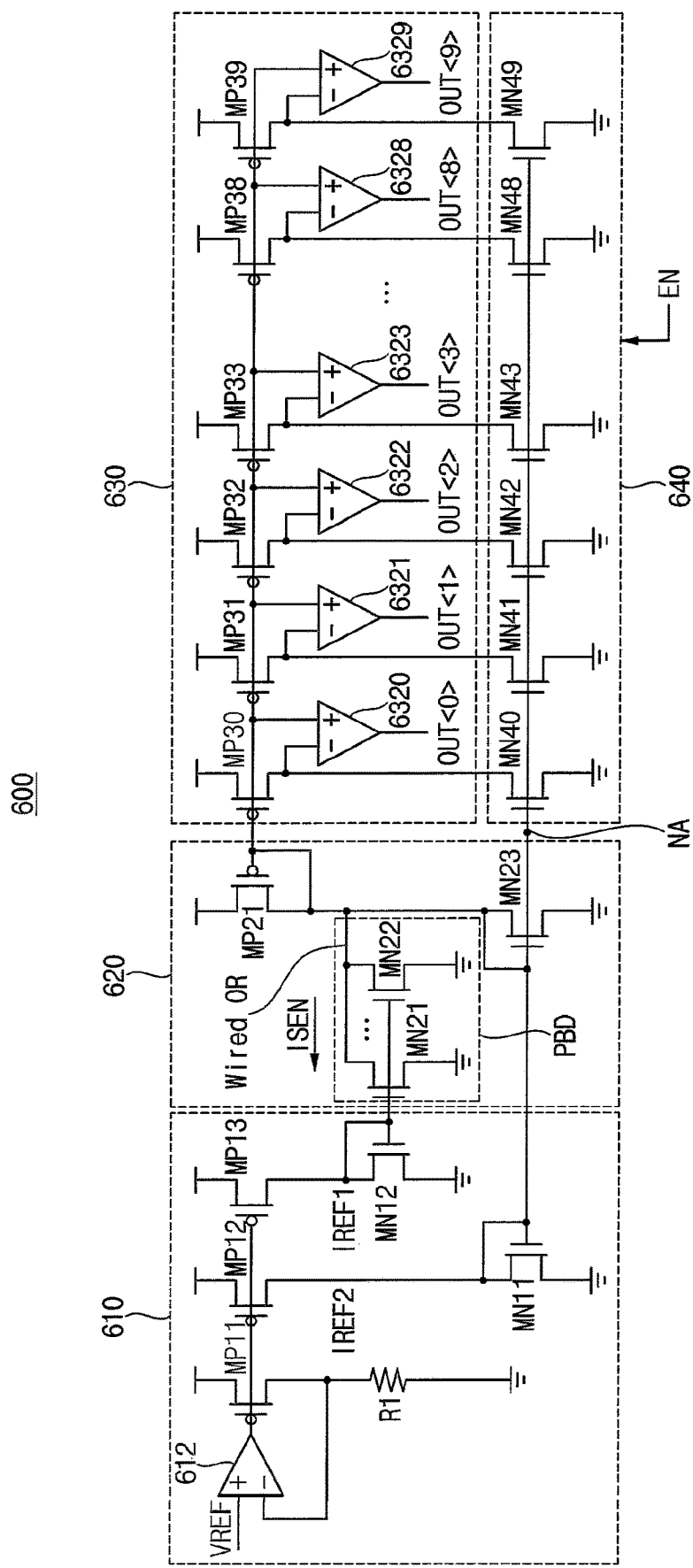
FIGS. 7A and 7B are circuit diagrams illustrating an example of an analog-to-digital converter included in the cell counter of FIG. 6 according to example embodiments.
Figure 7B:
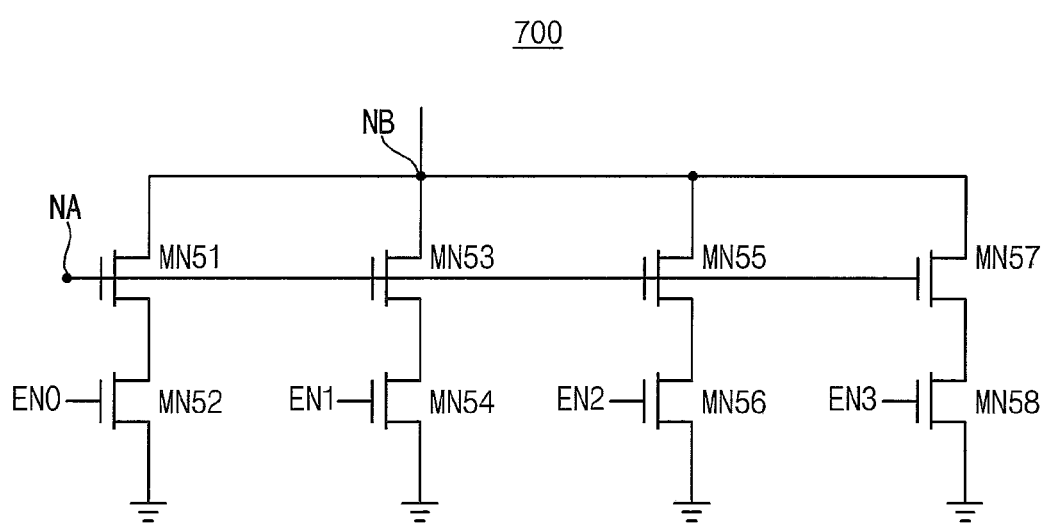

FIGS. 7A and 7B are circuit diagrams illustrating an example of an analog-to-digital converter included in the cell counter of FIG. 6 according to example embodiments.

Referring to FIG. 7A, an analog-to-digital converter 600 may include a first circuit 610, a second circuit 620, a third circuit 630 and a fourth circuit 640.

The first circuit 610 may generate reference currents IREF1 and IREF2 based on the reference voltage VREF. The first circuit 610 may be referred to as a reference current generator. The first circuit 610 may include an operational amplifier 612, a resistor R1 and a plurality of transistor circuits MP11, MP12, MP13, MN11 and MN12.

The operational amplifier 612 may include a first input terminal receiving the reference voltage VREF, a second input terminal connected to the resistor R1, and an output terminal. The transistor circuit MP11 and the resistor R1 may be connected in series between a power supply voltage and a ground voltage. The transistor circuits MP12 and MN11 may be connected in series between the power supply voltage and the ground voltage. The transistor circuits MP13 and MN12 may be connected in series between the power supply voltage and the ground voltage. Gate electrodes of the transistor circuits MP11, MP12, and MP13 may be connected to the output terminal of the operational amplifier 612. A gate electrode of the transistor circuit MN11 may be connected to drain electrodes of the transistor circuits MP12 and MN11. A gate electrode of the transistor circuit MN12 may be connected to drain electrodes of the transistor circuits MP13 and MN12. The reference current IREF2 may flow through the transistor circuits MP12 and MN11, and the reference current IREF1 may flow through the transistor circuits MP13 and MN12.

The second circuit 620 may be connected to the first circuit 610, and may receive a sensing current ISEN obtained from memory cells. The second circuit 620 may be referred to as a sensing circuit. The second circuit 620 may include page buffer decoders PBD and transistor circuits MP21 and MN23. The page buffer decoders PBD may include transistor circuits MN21 and MN22.

The page buffer decoders PBD may be connected to a wired OR line in parallel between a node of the wired OR line and the ground voltage. Each page buffer decoder PBD may be connected to a corresponding bitline BL through the page buffer circuit 130. The transistor circuits MP21 and MN23 may be connected in series between the power supply voltage and the ground voltage. Gate electrodes of the transistor circuits MN21 and MN22 may be connected to the gate electrode of the transistor circuit MN12. A gate electrode of the transistor circuit MP21 may be connected to drain electrodes of the transistor circuits MP21 and MN23. A gate electrode of the transistor circuit MN23 may be connected to the gate electrode of the transistor circuit MN11.

The third circuit 630 may be connected to the second circuit 620, and may generate a plurality of digital bits OUT<0>, OUT<1>, OUT<2>, OUT<3>, . . . , OUT<8> and OUT<9> that represent a result of the sensing operation. The third circuit 630 may be referred to as an output circuit. The third circuit 630 may include a plurality of transistor circuits MP30, MP31, MP32, MP33, . . . , MP38 and MP39 and a plurality of operational amplifiers 6320, 6321, 6322, 6323, . . . , 6328 and 6329.

The fourth circuit 640 may be connected to the second circuit 620 and the third circuit 630, and may include a plurality of transistors that are selectively turned on and off based on the plurality of enable signals EN. The fourth circuit 640 may be referred to as a measurement window shifting control circuit. The fourth circuit 640 may include a plurality of transistor circuits MN40, MN41, MN42, MN43, . . . , MN48 and MN49.

The transistor circuits MP30 and MN40 may be connected in series between the power supply voltage and the ground voltage. The transistor circuits MP31 and MN41 may be connected in series between the power supply voltage and the ground voltage. The transistor circuits MP32 and MN42 may be connected in series between the power supply voltage and the ground voltage. The transistor circuits MP33 and MN43 may be connected in series between the power supply voltage and the ground voltage. The transistor circuits MP38 and MN48 may be connected in series between the power supply voltage and the ground voltage. The transistor circuits MP39 and MN49 may be connected in series between the power supply voltage and the ground voltage. Gate electrodes of the transistor circuits MP30 through MP39 may be connected to the gate electrode of the transistor circuit MP21. Gate electrodes of the transistor circuits MN40 through MN49 may be connected to the gate electrode (e.g., a node NA) of the transistor circuit MN23. The sensing current ISEN may flow through the gate electrodes of the transistor circuits MP30 through MP39.

The operational amplifier 6320 may include first and second input terminals connected to the gate electrode and the drain electrode of the transistor circuit MP30, respectively, and an output terminal outputting the digital bit OUT<0>. The operational amplifier 6321 may include first and second input terminals connected to the gate electrode and the drain electrode of the transistor circuit MP31, respectively, and an output terminal outputting the digital bit OUT<1>. The operational amplifier 6322 may include first and second input terminals connected to the gate electrode and the drain electrode of the transistor circuit MP32, respectively, and an output terminal outputting the digital bit OUT<2>. The operational amplifier 6323 may include first and second input terminals connected to the gate electrode and the drain electrode of the transistor circuit MP33, respectively, and an output terminal outputting the digital bit OUT<3>. The operational amplifier 6328 may include first and second input terminals connected to the gate electrode and the drain electrode of the transistor circuit MP38, respectively, and an output terminal outputting the digital bit OUT<8>. The operational amplifier 6329 may include first and second input terminals connected to the gate electrode and the drain electrode of the transistor circuit MP39, respectively, and an output terminal outputting the digital bit OUT<9>.

In some example embodiments, the resolution and/or capacity of the cell counting operation may be changed by controlling or adjusting an analog signal applied to the analog-to-digital converter 600. For example, the width of the measurement range of the measurement window and the widths of the plurality of measurement intervals of the measurement window may be changed by adjusting the reference voltage VREF that is an analog voltage. In some example embodiments, a magnification of the analog-to-digital converter 600 may be further controlled or adjusted.

Although FIG. 7A illustrates the 10-bit analog-to-digital converter 600 that generates the ten digital bits OUT<0> through OUT<9>, the invention is not limited thereto, and the number of bits generated from the analog-to-digital converter 600 may be changed according to example embodiments.

For convenience of illustration, each transistor circuit is illustrated as one transistor in FIG. 7A. However, in fact, each transistor circuit may include a plurality of transistors connected in parallel. For example, the transistor circuit MP11 may include six transistors connected in parallel, each of the transistor circuits MP12 and MN12 may include twenty transistors connected in parallel, the transistor circuit MP13 may include one to thirty one transistors connected in parallel, the transistor circuit MN11 may include forty transistors connected in parallel, each of the transistor circuits MN21 and MN22 may include two transistors connected in parallel, each of the transistor circuits MP21, MP30 and MP31 may include twenty four transistors connected in parallel, each of the transistor circuits MP32, MP33, MP38 and MP39 may include 12 transistors connected in parallel, and the transistor circuits MN23, MN40, MN41, MN42, MN43, MN48 and MN49 may include different numbers (e.g., ten, twelve, sixteen, eleven, fifteen, thirty five and thirty nine) of transistors connected in parallel, but the invention is not limited thereto. For example, each of the transistor circuits MP11, MP12, MP13, MP21 and MP30 through MP39 may include p-type metal oxide semiconductor (PMOS) transistors, and each of the transistor circuits MN11, MN12, MN21, MN22, MN23 and MN40 through MN49 may include n-type metal oxide semiconductor (NMOS) transistors.

Referring to FIG. 7B, a transistor circuit 700 may include a plurality of transistor circuits MN51, MN52, MN53, MN54, MN55, MN56, MN57 and MN58. The transistor circuit 700 may be one of the transistor circuits MN40 through MN49 included in the fourth circuit 640 of FIG. 7A.

The transistor circuits MN51 and MN52 may be connected in series between a node NB (e.g., a drain of one of the transistor circuits MP30 through MP39) and the ground voltage. The transistor circuits MN53 and MN54 may be connected in series between the node NB and the ground voltage. The transistor circuits MN55 and MN56 may be connected in series between the node NB and the ground voltage. The transistor circuits MN57 and MN58 may be connected in series between the node NB and the ground voltage. Gate electrodes of the transistor circuits MN51, MN53, MN55 and MN57 may be connected to a node NA (e.g., the gate electrode of the transistor circuit MN23). A gate electrode of each of the transistor circuits MN52, MN54, MN56 and MN58 may receive a respective one of a plurality of enable signals EN0, EN1, EN2 and EN3.

In some example embodiments, a shifting operation for shifting the measurement window may be performed based on the plurality of enable signals EN0, EN1, EN2 and EN3 applied to the transistor circuit 700. For example, the position of the measurement window may be shifted based on the number of transistors turned on by the plurality of enable signals EN0, EN1, EN2 and EN3, and the width of the measurement range of the measurement window and the widths of the plurality of measurement intervals of the measurement window may not be changed.

When the resolution and/or capacity of the cell counting operation are changed by controlling the analog signal (e.g., the reference voltage VREF), it should be required a relatively long time to perform an additional sensing operation. In contrast, according to example embodiments, when the transistor circuit 700 is implemented to receive the plurality of enable signals EN0, EN1, EN2 and EN3 and when the shifting operation for shifting the measurement window is performed while the width of the measurement range and the widths of the plurality of measurement intervals are maintained (e.g., without changing the analog signal), it may be used a relatively short time to perform the additional sensing operation.

Similar to that described with reference to FIG. 7A, each transistor circuit in FIG. 7B may include at least one transistor connected in parallel. For example, when the transistor circuit 700 corresponds to the transistor circuit MN48 in FIG. 7A, each of the transistor circuits MN51 and MN52 may include thirty two transistors, and each of the transistor circuits MN53, MN54, MN55, MN56, MN57 and MN58 may include one transistor.

Figure 8A:
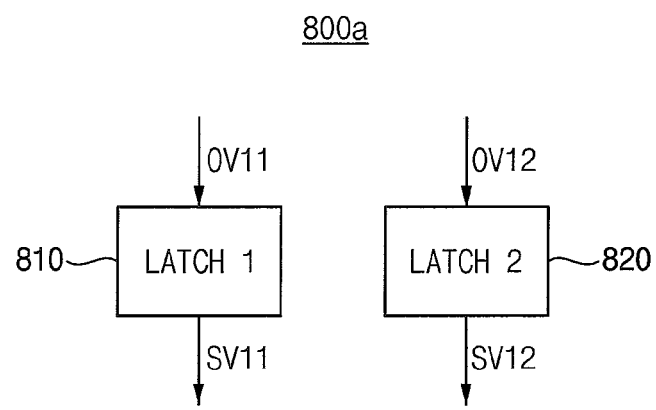
FIGS. 8A and 8B are block diagrams illustrating examples of a storage included in the cell counter of FIG. 6 according to example embodiments.
Figure 8B:
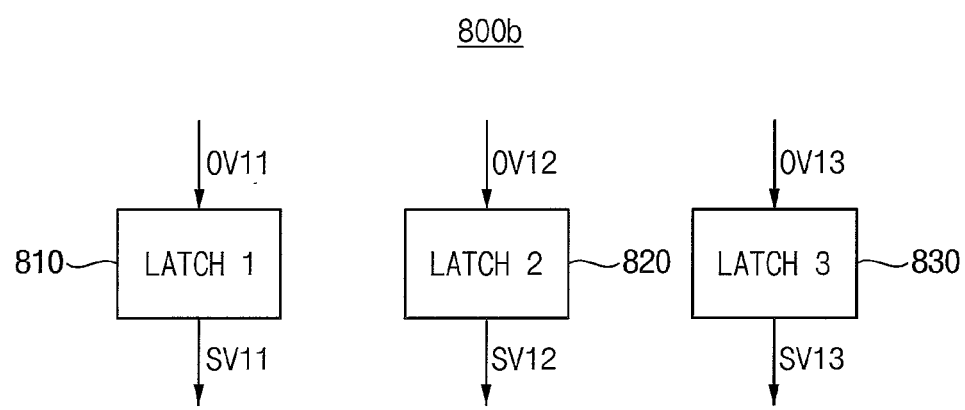

FIGS. 8A and 8B are block diagrams illustrating examples of a storage included in the cell counter of FIG. 6 according to example embodiments.

Referring to FIG. 8A, the storage 800a may include a first latch 810 and a second latch 820. The storage 800a may be the storage 514 in FIG. 6.

The first latch 810 may store a result OV11 of the first sensing operation for the first memory cells, and the second latch 820 may store a result OV12 of the second sensing operation for the first memory cells. The first and second latches 810 and 820 may output stored values SV11 and SV12, respectively.

Referring to FIG. 8B, the storage 800b may include a first latch 810, a second latch 820 and a third latch 830. The storage 800b may be the storage 514 in FIG. 6.

The first and second latches 810 and 820 may be the same as the first and second latches 810 and 820 in FIG. 8A, respectively. The third latch 830 may store a result OV13 of a third sensing operation for the first memory cells, and may output a stored value SV13.

The third sensing operation may be performed on the first memory cells based on the measurement window shifted by a second shifting operation. The measurement range and the plurality of measurement intervals may have a third range and a plurality of third intervals, respectively. A third digital value and/or a third count value may be obtained as a result of the third sensing operation. In this case, a final count value for the first memory cells may be obtained based on a result (e.g., the first digital value and/or the first count value) of the first sensing operation, a result (e.g., the second digital value and/or the second count value) of the second sensing operation, and a result (e.g., the third digital value and/or the third count value) of the third sensing operation.

In some example embodiments, the storage 800a of FIG. 8A may be used to perform the method of counting the number of memory cells described with reference to FIG. 1 and/or the method of counting the number of memory cells which will be described with reference to FIG. 18, and the storage 800b of FIG. 8B may be used to perform the method of counting the number of memory cells which will be described with reference to FIG. 23.

Figure 9:
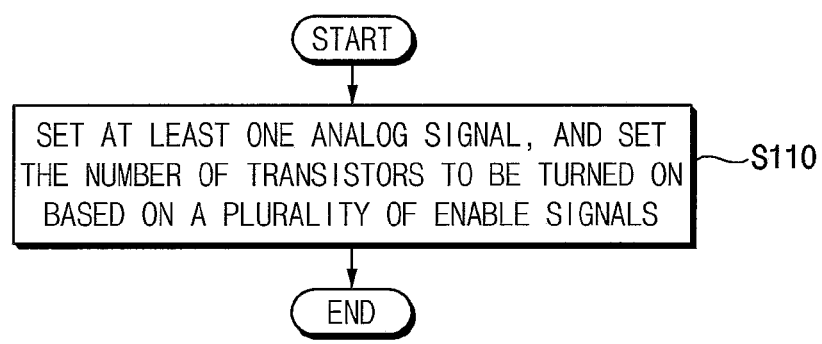
FIG. 9 is a flowchart illustrating an example of performing an initial setting operation in FIG. 1 according to example embodiments.
Figure 10A:
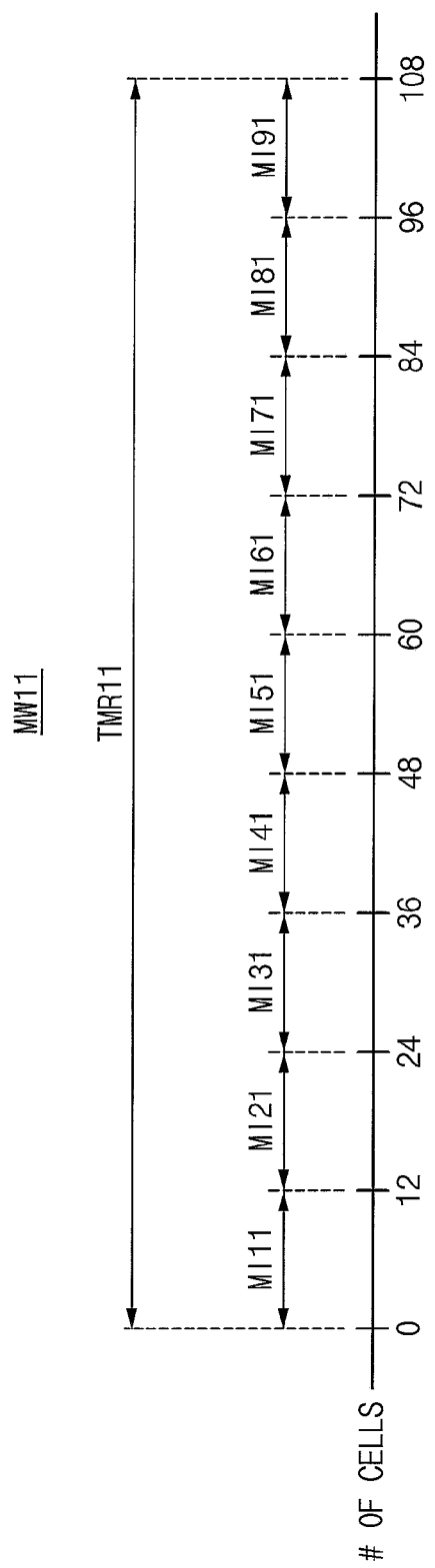

FIG. 9 is a flowchart illustrating an example of performing an initial setting operation in FIG. 1 according to example embodiments. FIGS. 10A and 10B are diagrams for describing an operation of FIG. 9 according to example embodiments.

Referring to FIGS. 1, 9, 10A and 10B, when performing the initial setting operation on the measurement range and the plurality of measurement intervals of the measurement window (step S100), at least one analog signal applied to an analog-to-digital converter may be set, and the number of transistors to be turned on among transistors included in the analog-to-digital converter may be set based on a plurality of enable signals applied to the analog-to-digital converter (step S110).

For example, a level of the reference voltage VREF applied to the analog-to-digital converter 600 of FIG. 7A may be set to a first level, and at least some of the plurality of enable signals EN0, EN1, EN2 and EN3 applied to the transistor circuit 700 of FIG. 7B may be activated. For example, in step S110, all of the enable signals EN0, EN1, EN2 and EN3 may be activated, and all of the transistor circuits MN51, MN52, MN53, MN54, MN55, MN56, MN57 and MN58 may be turned on.

In some example embodiments, when the initial setting operation of step S100 is performed, the measurement range and the plurality of measurement intervals may be set to the first range and the plurality of first intervals, respectively. For example, a measurement window MW11 may be initially set as illustrated in FIG. 10A. The measurement window MW11 may have a measurement range TMR11 and a plurality of measurement intervals MI11, MI21, MI31, MI41, MI51, MI61, MI71, MI81 and MI91. For example, a width of the measurement range TMR11 may be one hundred eight, and a width of each measurement interval may be twelve. For example, the number of memory cells that can be counted using the measurement window MW11 may be one hundred eight, and the resolution of the measurement window MW11 may be twelve.

As illustrated in FIG. 10B, when a digital value OUT<0:9> output from the analog-to-digital converter 600 is '1000000000' (e.g., when only the digital bit OUT<0> is '1'), an output may not correspond to any measurement interval, and a cell count value may be obtained as zero. When the digital value OUT<0:9> is '1100000000' (e.g., the digital bits OUT<0> and OUT<1> are '1'), the output may correspond to the measurement interval MI11, and the cell count value may be obtained as six that is a center value of the measurement interval MI11. Similarly, when the digital value OUT<0:9> is '1110000000', '1111000000', '1111100000', '1111110000', '1111111000', '1111111100', '1111111110' and '1111111111', the output may correspond to a respective one of the measurement intervals MI21, MI31, MI41, MI51, MI61, MI71, MI81 and MI91, and the cell count value may be obtained as a respective one of eighteen, thirty, forty two, fifty four, sixty six, seventy eight, ninety and one hundred two.

Figure 11:
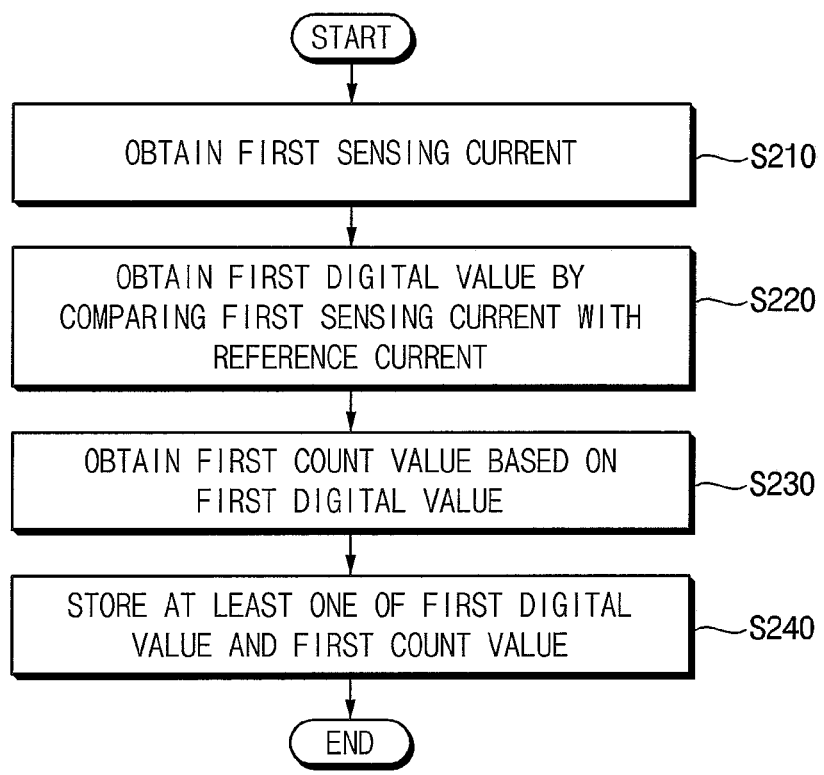
FIG. 11 is a flowchart illustrating an example of performing a first sensing operation in FIG. 1 according to example embodiments.
Figure 12:
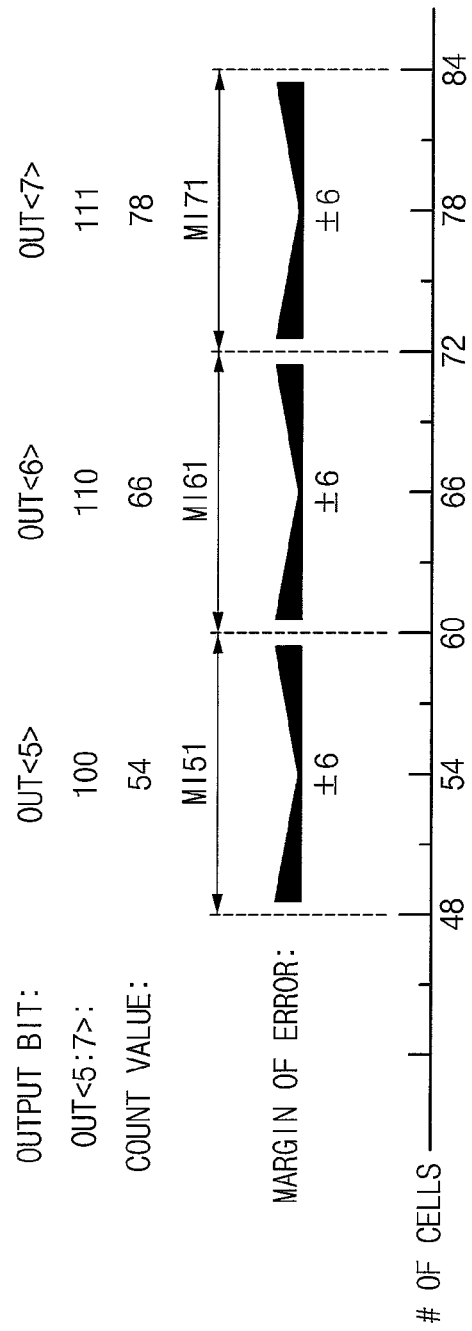
FIG. 12 is a diagram for describing an operation of FIG. 11 according to example embodiments.

FIG. 11 is a flowchart illustrating an example of performing a first sensing operation in FIG. 1 according to example embodiments. FIG. 12 is a diagram for describing an operation of FIG. 11 according to example embodiments.

Referring to FIGS. 1, 11 and 12, when performing the first sensing operation on the first memory cells (step S200), the first sensing operation may be performed based on the measurement window set by step S100.

For example, a first sensing current may be obtained from the first memory cells (step S210), a first digital value may be obtained by comparing the first sensing current with a reference current based on the measurement window (step S220), a first count value may be obtained based on the first digital value (step S230), and at least one of the first digital value and the first count value may be stored (step S240).

In some example embodiments, when step S200 is performed based on the measurement window MW11 illustrated in FIGS. 10A and 10B, a result of the first sensing operation may be obtained as illustrated in FIG. 12. For convenience of illustration, FIG. 12 illustrates only a portion OUT<5:7> of the digital value OUT<0:9> as the first digital value.

For example, when the digital value OUT<5:7> that is output from the analog-to-digital converter 600 by performing the first sensing operation is '100' (e.g., when the digital value OUT<0:9> is '1111110000'), the output may correspond to the measurement interval MI51, and the first count value may be obtained as fifty four. Similarly, when the digital value OUT<5:7> is '110' and '111', the output may correspond to a respective one of the measurement intervals MI61 and MI71, and the first count value may be obtained as a respective one of sixty six and seventy eight. A margin of error of the first count value may be ±6. For example, at least one of the first digital value and the first count value that are a result of the first sensing operation may be stored in the first latch 810 of FIG. 8A.

Figure 13:
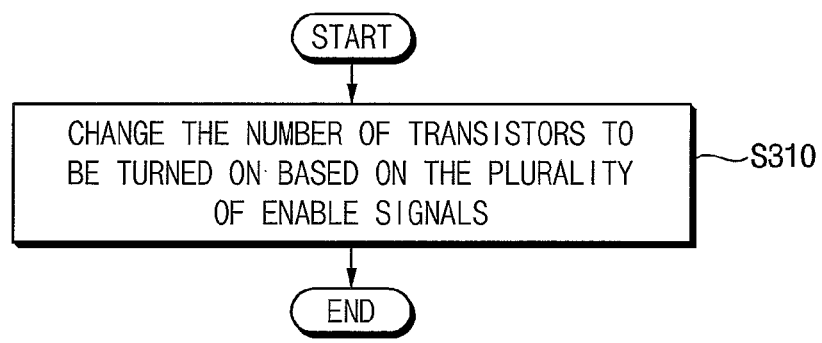
FIG. 13 is a flowchart illustrating an example of performing a first shifting operation in FIG. 1 according to example embodiments.
Figure 14A:
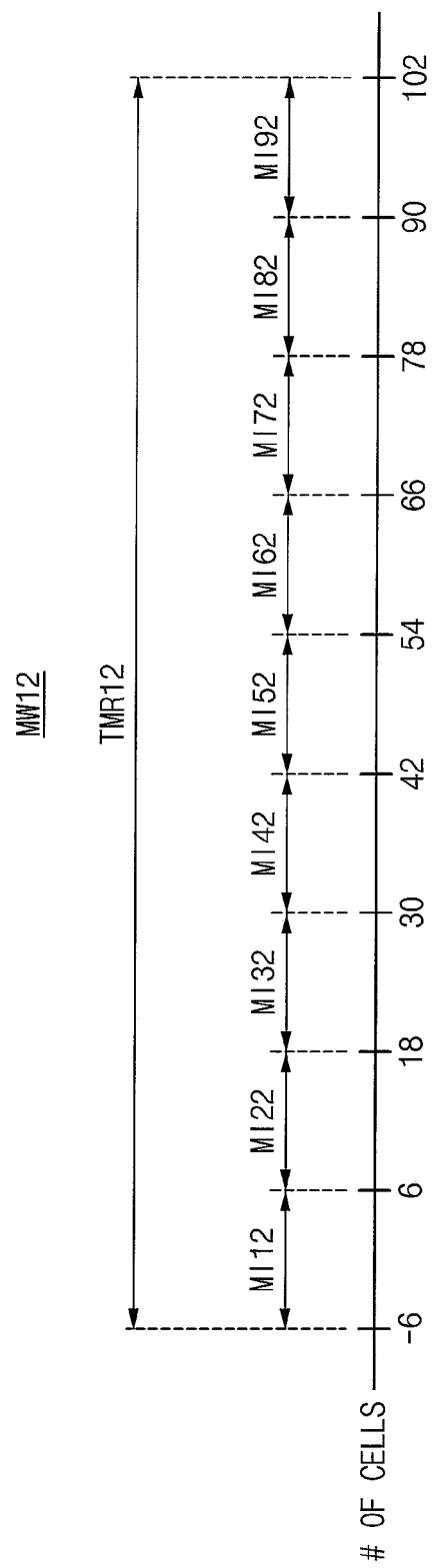

FIG. 13 is a flowchart illustrating an example of performing a first shifting operation in FIG. 1 according to example embodiments. FIGS. 14A and 14B are diagrams for describing an operation of FIG. 13 according to example embodiments.

Referring to FIGS. 1, 13, 14A and 14B, when performing the first shifting operation on the measurement window while the width of the measurement range and the widths of the plurality of measurement intervals are maintained (step S300), the number of transistors to be turned on among the transistors included in the analog-to-digital converter may be changed based on the plurality of enable signals (step S310). The analog signal applied to the analog-to-digital converter may not be changed, but may be maintained.

For example, the activation and deactivation of the plurality of enable signals EN0, EN1, EN2 and EN3 applied to the transistor circuit 700 of FIG. 7B may be controlled. For example, in step S310, the enable signals EN0 and EN1 may be activated and the transistor circuits MN51, MN52, MN53 and MN54 may be turned on, and the enable signals EN2 and EN3 may be deactivated and the transistor circuits MN55, MN56, MN57 and MN58 may be turned off. The level of the reference voltage VREF may be maintained to the first level set by step S110 in FIG. 9.

In some example embodiments, when the first shifting operation of step S300 is performed, the measurement range and the plurality of measurement intervals may be set to the second range and the plurality of second intervals, respectively. For example, a measurement window MW12 may be shifted as illustrated in FIG. 14A. The measurement window MW12 may have a measurement range TMR12 and a plurality of measurement intervals MI12, MI22, MI32, MI42, MI52, MI62, MI72, MI82 and MI92. For example, a width of the measurement range TMR12 may be one hundred eight that is equal to the width of the measurement range TMR11 in FIG. 10A, and a width of each measurement interval may be twelve that is equal to the width of each measurement interval in FIG. 10A.

As illustrated in FIG. 14B, when the digital value OUT<0:9> output from the analog-to-digital converter 600 is '1000000000', the output may not correspond to any measurement interval, and the cell count value may be obtained as zero. When the digital value OUT<0:9> is '1100000000', '1110000000', '1111000000', '1111100000', '1111110000', '1111111000', '1111111100', '1111111110' and '1111111111', the output may correspond to a respective one of the measurement intervals MI12, MI22, MI32, MI42, MI52, MI62, MI72, MI82 and MI92, and the cell count value may be obtained as a respective one of zero, twelve, twenty four, thirty six, fourth eight, sixth, seventy two, eighty four and ninety six.

In some example embodiments, boundary values of the measurement intervals MI11 through MI91 in FIG. 10A and boundary values of the measurement intervals MI12 through MI92 in FIG. 14A may not overlap each other, and the boundary values of the measurement intervals MI12 through MI92 may correspond to (or coincide with) center values of the measurement intervals MI11 through MI91. For example, the measurement window MW12 may be shifted such that the boundary values are located at centers of the measurement intervals MI11 through MI91.

Figure 15:
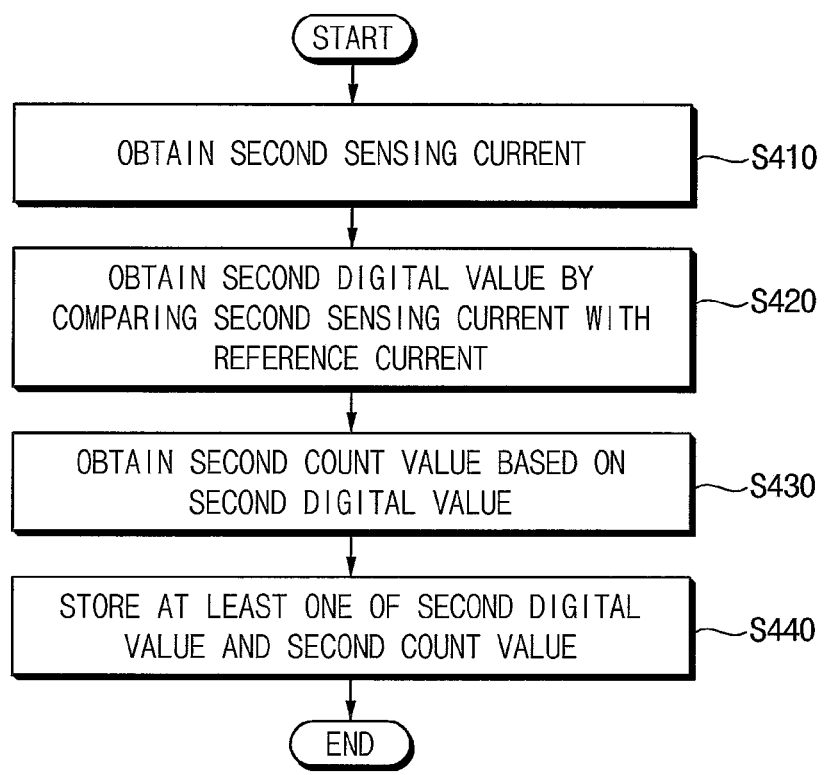
FIG. 15 is a flowchart illustrating an example of performing a second sensing operation in FIG. 1 according to example embodiments.
Figure 16:
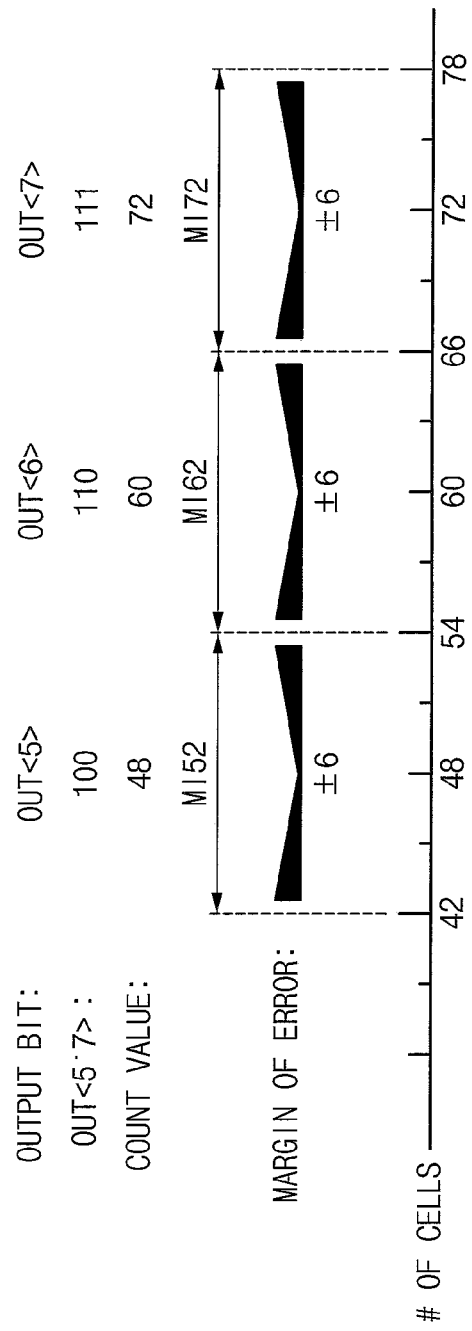
FIG. 16 is a diagram for describing an operation of FIG. 15 according to example embodiments.

FIG. 15 is a flowchart illustrating an example of performing a second sensing operation in FIG. 1 according to example embodiments. FIG. 16 is a diagram for describing an operation of FIG. 15 according to example embodiments.

Referring to FIGS. 1, 15 and 16, when performing the second sensing operation on the first memory cells (step S400), the second sensing operation may be performed based on the measurement window shifted by step S300.

For example, a second sensing current may be obtained from the first memory cells (step S410), a second digital value may be obtained by comparing the second sensing current with the reference current based on the shifted measurement window to (step S420), a second count value may be obtained based on the second digital value (step S430), and at least one of the second digital value and the second count value may be stored (step S440). In some example embodiments, the second sensing current may be substantially the same as the first sensing current, and thus step S410 may be omitted.

In some example embodiments, when step S400 is performed based on the measurement window MW12 illustrated in FIGS. 14A and 14B, a result of the second sensing operation may be obtained as illustrated in FIG. 16. For convenience of illustration, FIG. 16 illustrates only a portion OUT<5:7> of the digital value OUT<0:9> as the second digital value.

For example, when the digital value OUT<5:7> that is output from the analog-to-digital converter 600 by performing the second sensing operation is '100', the output may correspond to the measurement interval MI52, and the second count value may be obtained as forty eight. Similarly, when the digital value OUT<5:7> is '110' and '111', the output may correspond to a respective one of the measurement intervals MI62 and MI72, and the second count value may be obtained as a respective one of sixty and seventy two. A margin of error of the second count value may be ±6. For example, at least one of the second digital value and the second count value that are a result of the second sensing operation may be stored in the second latch 820 of FIG. 8A.

Figure 17:
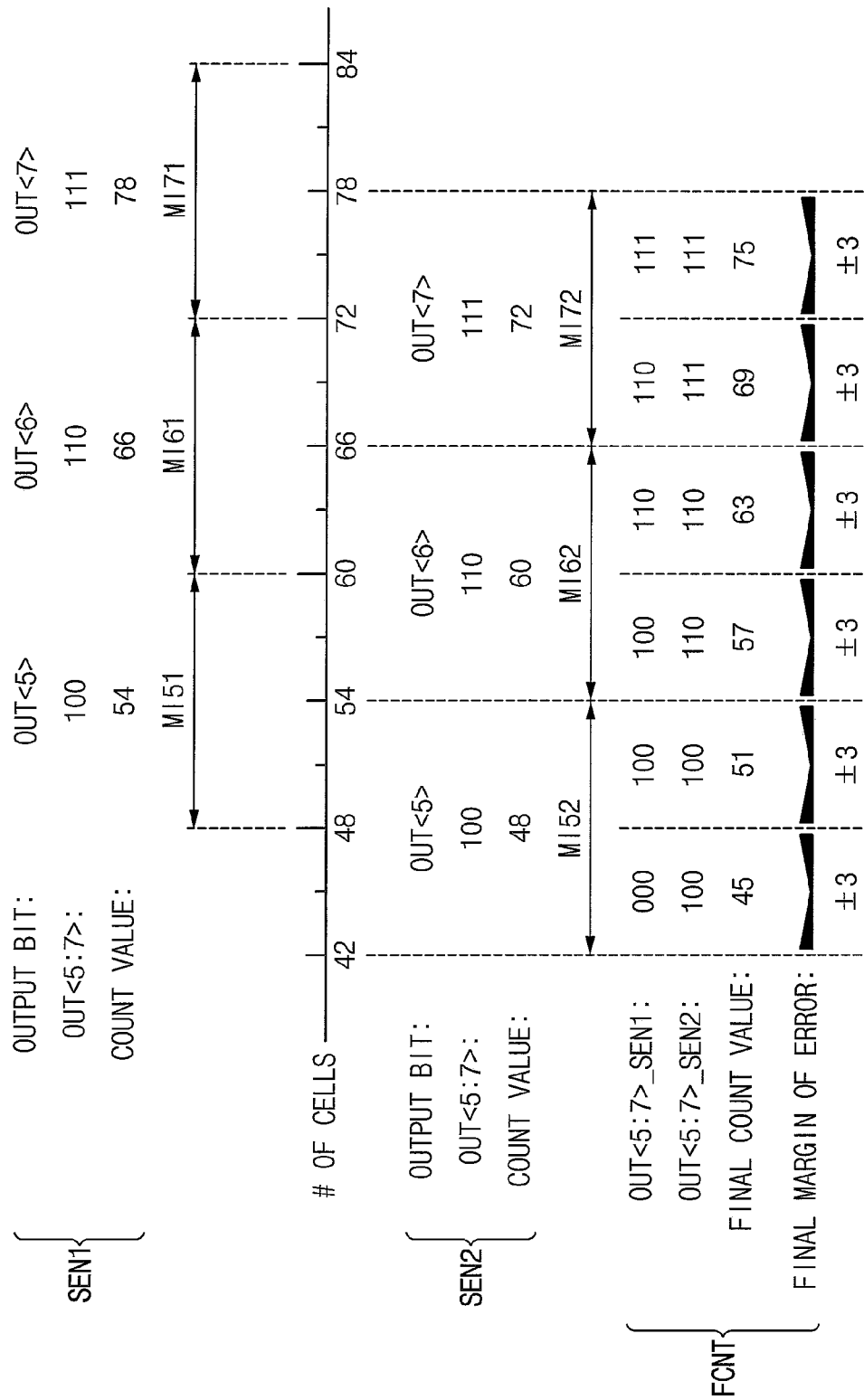
FIG. 17 is a diagram for describing an example of obtaining a final count value in FIG. 1 according to example embodiments.

FIG. 17 is a diagram for describing an example of obtaining a final count value in FIG. 1 according to example embodiments.

Referring to FIG. 17, a final count result FCNT for the first memory cells may be obtained based on a result SEN1 of the first sensing operation described with reference to FIG. 12 and a result SEN2 of the second sensing operation described with reference to FIG. 16.

For example, when a first digital value OUT<5:7>_SEN1 and a second digital value OUT<5:7>_SEN2 are '000' and '100', respectively, it may represent that the first count value and the second count value are forty two and forty eight, respectively, and thus the final count value may be obtained as forty five that is an intermediate value between the first and second count values. Similarly, when the first digital value OUT<5:7> _SEN1 is '100', '100', '110', '110' and '111', and when the second digital value OUT<5:7>_SEN2 is '100', '110', '110', '111' and '111', the final count value may be obtained as a respective one of fifty one, fifty seven, sixth three, sixty nine and seventy five. A margin of error of the final count value may be ±3. As compared with the result SEN1 of the first sensing operation, the margin of error may be reduced in the final count result FCNT by a half for the same measurement range. Thus, as compared with the count result based on the initial setting operation (e.g., as compared with the example of FIG. 12), the capacity may be maintained in the final count result FCNT and the resolution may be doubled in the final count result FCNT (e.g., the measurement range may be maintained to one hundred eight and the measurement interval may be reduced to six).

Figure 18:
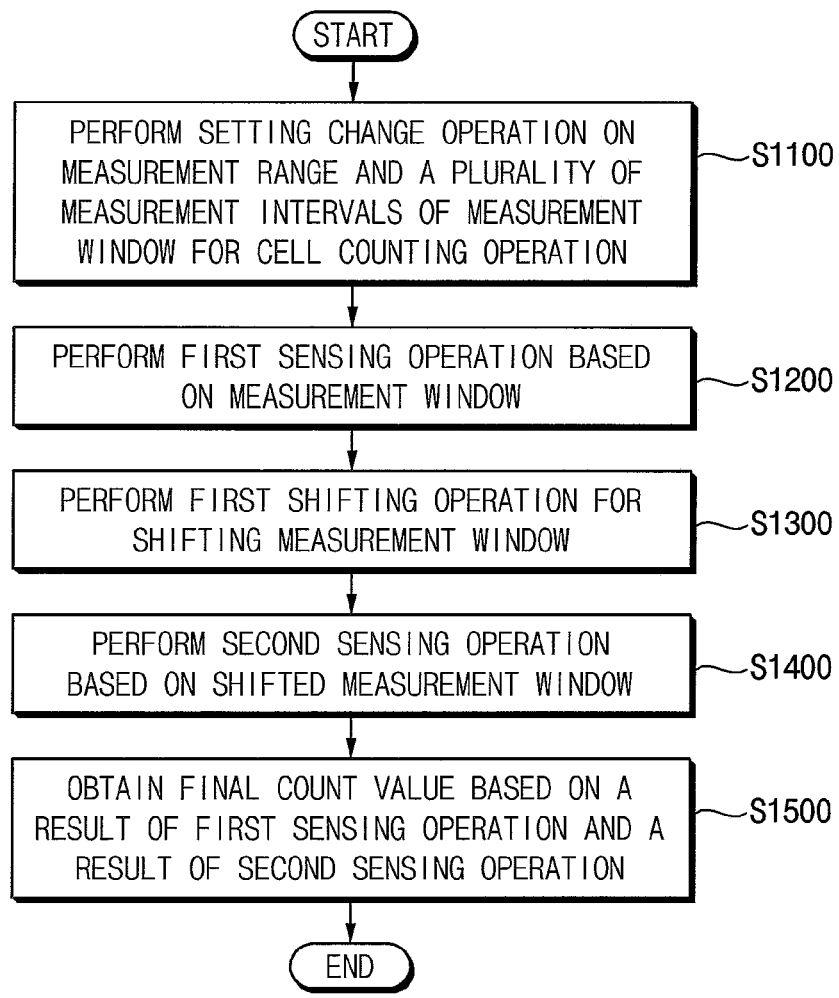
FIG. 18 is a flowchart illustrating a method of counting the number of memory cells in a nonvolatile memory device according to example embodiments.

FIG. 18 is a flowchart illustrating a method of counting the number of memory cells in a nonvolatile memory device according to example embodiments. The descriptions repeated with FIG. 1 will be omitted.

Referring to FIG. 18, in a method of counting the number of memory cells in a nonvolatile memory device according to example embodiments, a setting change operation is performed on the measurement range of the measurement window and the plurality of measurement intervals of the measurement window (step S1100). The setting change operation may represent an operation of changing a result of the initial setting operation performed by step S100 in FIG. 1, and may be performed after the initial setting operation. In an example embodiment, although not illustrated in FIG. 18, step S100 in FIG. 1 may be performed before step S1100.

In some example embodiments, when or after the setting change operation is performed, the measurement range and the plurality of measurement intervals may be changed to a third range and a plurality of third intervals, respectively. A width of the third range may be wider than the width of the first range, and a width of each of the plurality of third intervals may be wider than the width of each of the plurality of first intervals. For example, the width of the third range may be twice the width of the first range, and the width of each of the plurality of third intervals may be twice the width of each of the plurality of first intervals. Thus, as compared with the initial setting operation, the capacity of the cell counting operation may become doubled and the resolution of the cell counting operation may become halved.

Steps S1200, S1300, S1400 and S1500 may be similar to steps S200, S300, S400 and S500 of FIG. 1, respectively. For example, during the first sensing operation in step S1200, the measurement range and the plurality of measurement intervals may have the third range and the plurality of third intervals, respectively. After the first shifting operation in step S1300 and during the second sensing operation in step S1400, the measurement range and the plurality of measurement intervals may have a fourth range and the plurality of fourth intervals, respectively. A width of the fourth range may be equal to the width of the third range, and a width of each of the plurality of fourth intervals may be equal to the width of each of the plurality of third intervals.

In the method of counting the number of memory cells in the nonvolatile memory device according to example embodiments, two sensing operations may be performed by changing the measurement position of the measurement window on time, and the final count value may be obtained by combining the results of the two sensing operations. Thus, the cell count value with a fixed resolution and a relatively improved capacity may be obtained by performing an additional sensing operation with a relatively short time.

Figure 19:
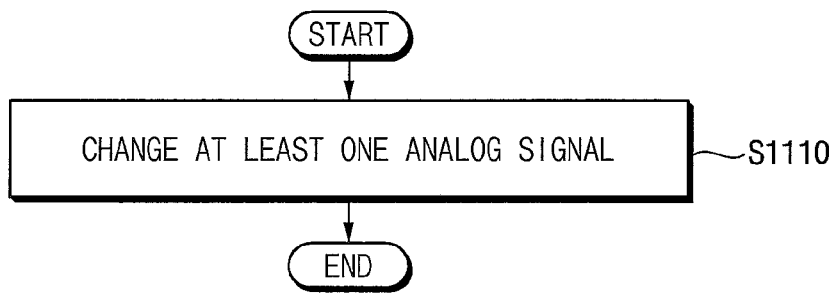
FIG. 19 is a flowchart illustrating an example of performing a setting change operation in FIG. 18 according to example embodiments.
Figure 20A:
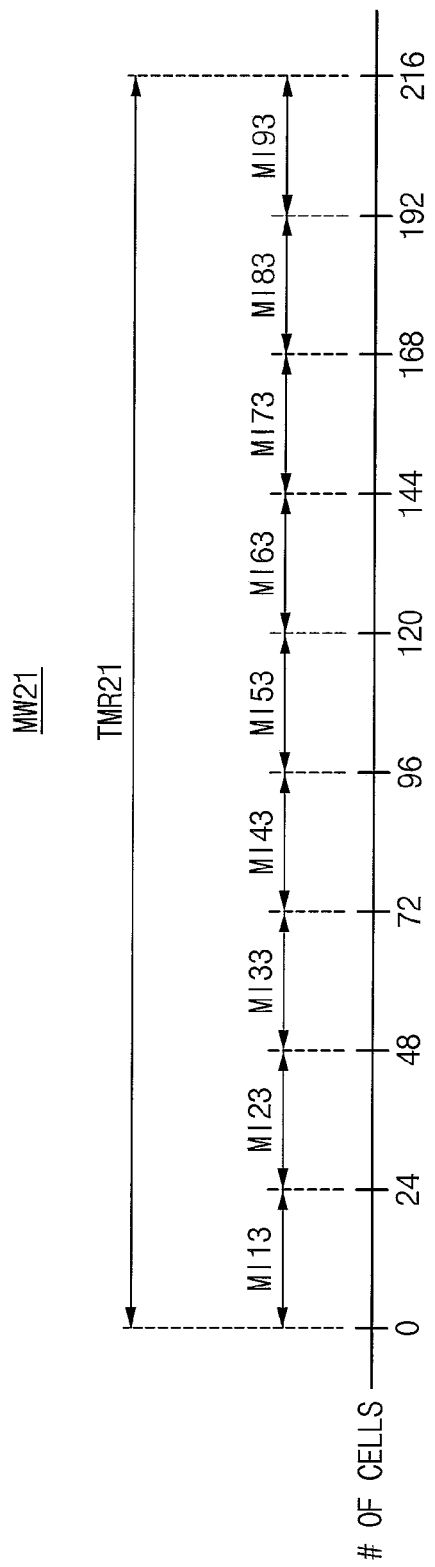

FIG. 19 is a flowchart illustrating an example of performing a setting change operation in FIG. 18 according to example embodiments. FIGS. 20A and 20B are diagrams for describing an operation of FIG. 19 according to example embodiments. The descriptions repeated with FIGS. 9, 10A and 10B will be omitted.

Referring to FIGS. 18, 19, 20A and 20B, when performing the setting change operation on the measurement range and the plurality of measurement intervals of the measurement window (step S1100), the analog signal applied to the analog-to-digital converter may be changed (step S1110). The plurality of enable signals applied to the analog-to-digital converter may not be changed, but may be maintained.

For example, the level of the reference voltage VREF applied to the analog-to-digital converter 600 of FIG. 7A may be changed from the first level set by step S110 in FIG. 9 to a second level different from the first level. The enable signals EN0, EN1, EN2 and EN3 may be set in the same manner (e.g., all of the enable signals EN0, EN1, EN2 and EN3 may be activated) as in step S110 of FIG. 9.

In some example embodiments, when the setting change operation of step S1100 is performed, the measurement range and the plurality of measurement intervals may be set to the third range and the plurality of third intervals, respectively. For example, a measurement window MW21 may be changed as illustrated in FIG. 20A. The measurement window MW21 may have a measurement range TMR21 and a plurality of measurement intervals MI13, MI23, MI33, MI43, MI53, MI63, MI73, MI83 and MI93. For example, a width of the measurement range TMR21 may be two hundreds sixteen that is twice the width of the measurement range TMR11 in FIG. 10A, and a width of each measurement interval may be twenty four that is twice the width of each measurement interval in FIG. 10A. Measurement intervals and cell count values depending on the digital values OUT<0:9> output from the analog-to-digital converter 600 may be implemented as illustrated in FIG. 20B.

Figure 21A:
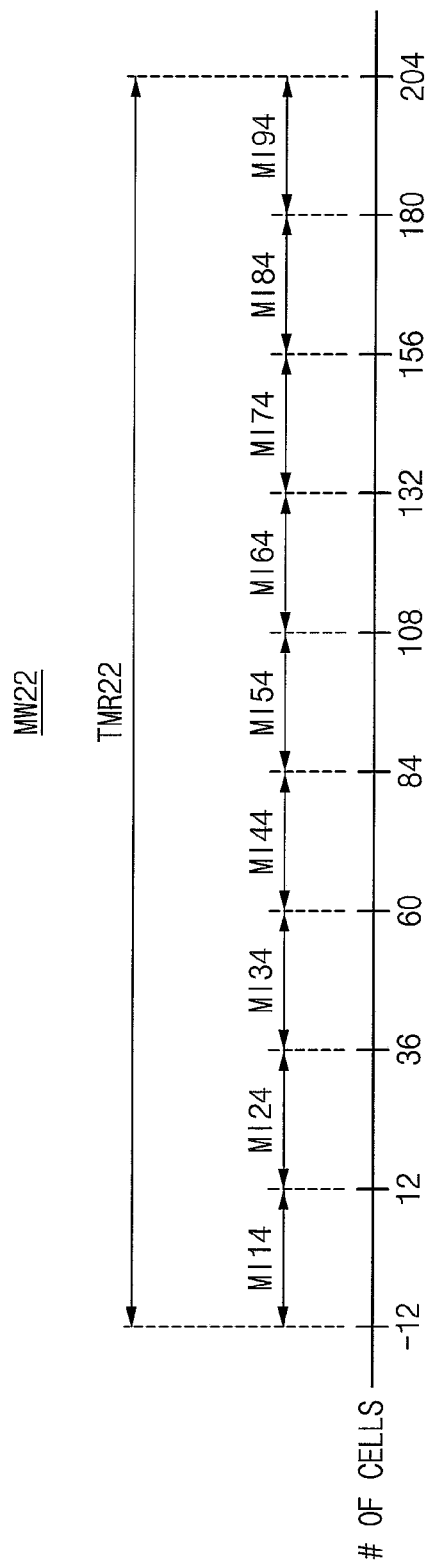

FIGS. 21A and 21B are diagrams for describing an example of performing a first shifting operation in FIG. 18 according to example embodiments. The descriptions repeated with FIGS. 13, 14A and 14B will be omitted.

Referring to FIGS. 21A and 21B, step S1300 in FIG. 18 may be similar to step S300 in FIG. 1. For example, step S1300 may be performed by activating the enable signals EN0 and EN1 and by deactivating the enable signals EN2 and EN3.

In some example embodiments, when the first shifting operation of step S1300 is performed, the measurement range and the plurality of measurement intervals may be set to the fourth range and the plurality of fourth intervals, respectively. For example, a measurement window MW22 may be shifted as illustrated in FIG. 21A. The measurement window MW22 may have a measurement range TMR22 and a plurality of measurement intervals MI14, MI24, MI34, MI44, MI54, MI64, MI74, MI84 and MI94. For example, a width of the measurement range TMR22 may be two hundreds sixteen that is equal to the width of the measurement range TMR21 in FIG. 20A, and a width of each measurement interval may be twenty four that is equal to the width of each measurement interval in FIG. 20A. Measurement intervals and cell count values depending on the digital values OUT<0:9> output from the analog-to-digital converter 600 may be implemented as illustrated in FIG. 21B.

In some example embodiments, boundary values of the measurement intervals MI13 through MI93 in FIG. 20A and boundary values of the measurement intervals MI14 through MI94 in FIG. 21A may not overlap each other, and the boundary values of the measurement intervals MI14 through MI94 may correspond to center values of the measurement intervals MI13 through MI93.

Figure 22:
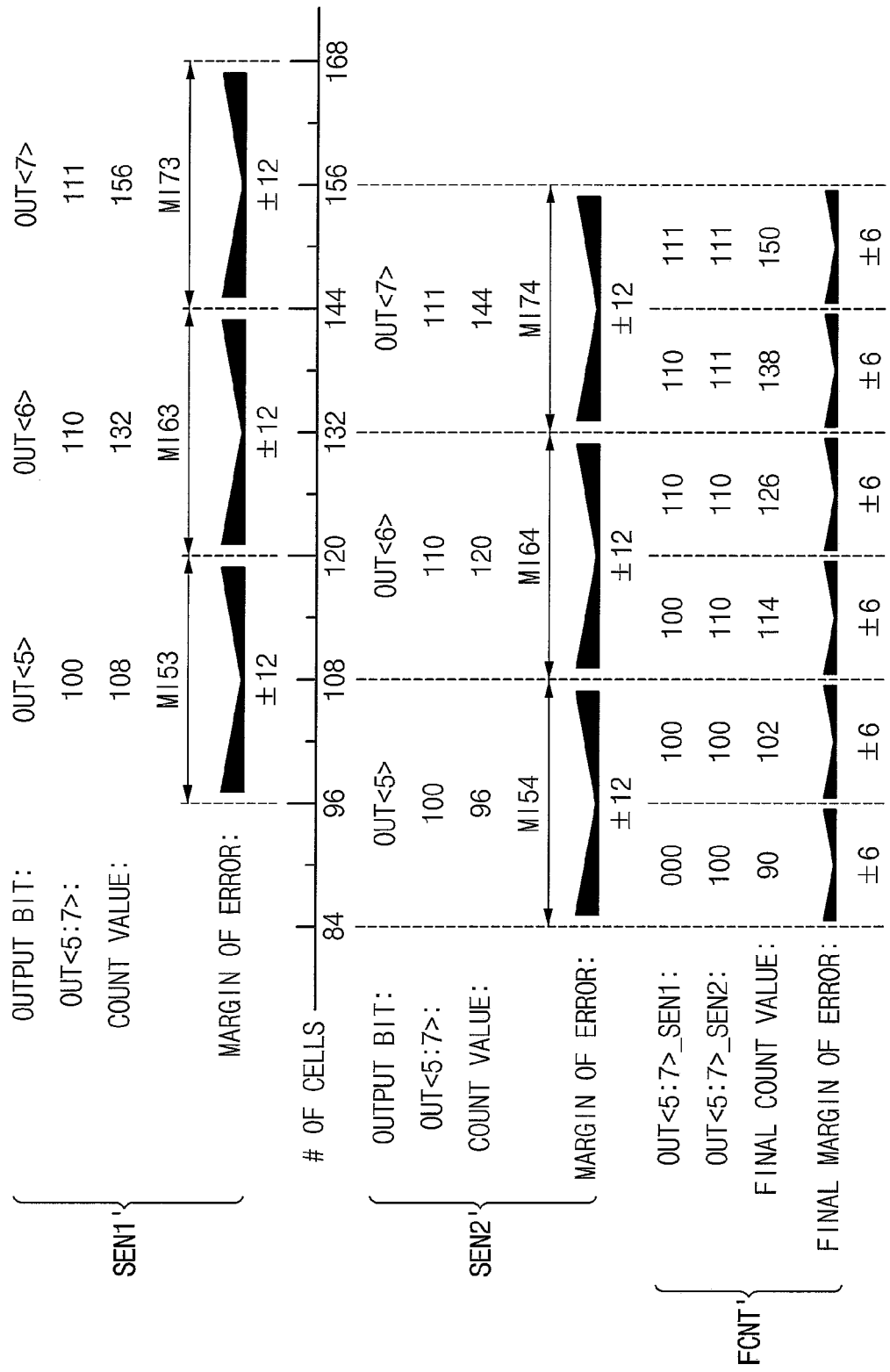
FIG. 22 is a diagram for describing an example of obtaining a final count value in FIG. 18 according to example embodiments.

FIG. 22 is a diagram for describing an example of obtaining a final count value in FIG. 18 according to example embodiments. The descriptions repeated with FIGS. 12, 16 and 17 will be omitted.

Referring to FIG. 22, a final count result FCNT' for the first memory cells may be obtained based on a result SEN1' of the first sensing operation performed by step S1200 in FIG. 18 and a result SEN2' of the second sensing operation performed by step S1400 in FIG. 18.

The result SEN1' of the first sensing operation may be similar to the result SEN1 of the first sensing operation in FIGS. 12 and 17, the result SEN2' of the second sensing operation may be similar to the result SEN2 of the second sensing operation in FIGS. 16 and 17, and a margin of error of each of the first and second count values may be ±12. When the first digital value OUT<5:7> _SEN1 and the second digital value OUT<5:7>_SEN2 are '000' and '100', respectively, it may represent that the first count value and the second count value are eighty four and ninety six, respectively, and thus the final count value may be obtained as ninety. Similarly, when the first digital value OUT<5:7> _SEN1 is '100', '100', '110', '110' and '111', and when the second digital value OUT<5:7>_SEN2 is '100', '110', '110', '111' and '111', the final count value may be obtained as a respective one of one hundred two, one hundred fourteen, one hundred twenty six, one hundred thirty eight and one hundred fifty. A margin of error of the final count value may be ±6. As compared with the result SEN1' of the first sensing operation, the margin of error may be reduced in the final count result FCNT' by a half for the same measurement range. Thus, as compared with the count result based on the initial setting operation (e.g., as compared with the example of FIG. 12), the resolution may be maintained in the final count result FCNT' and the capacity may be doubled in the final count result FCNT' (e.g., the measurement interval may be maintained to twelve and the measurement range may be increased to two hundreds sixteen).

Figure 23:
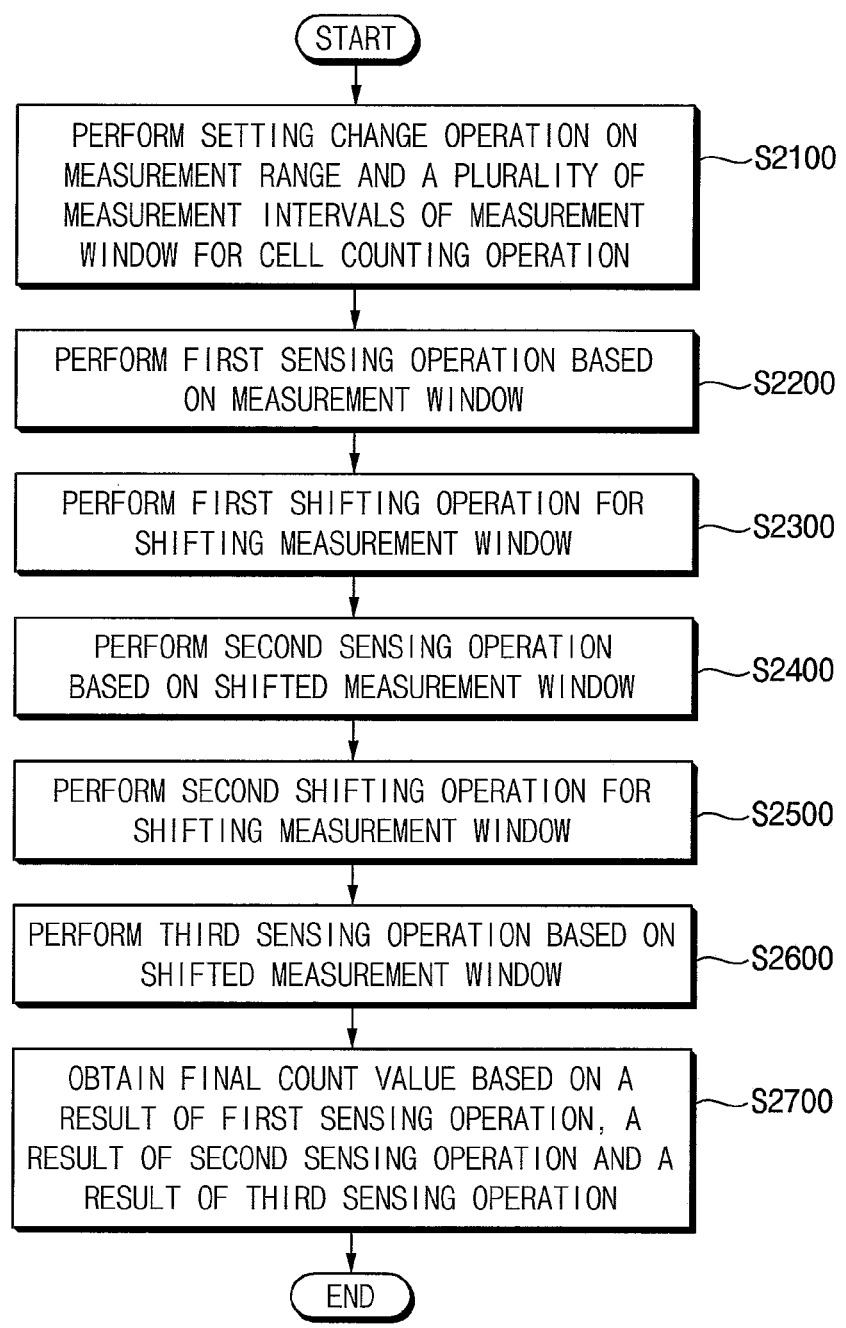
FIG. 23 is a flowchart illustrating a method of counting the number of memory cells in a nonvolatile memory device according to example embodiments.

FIG. 23 is a flowchart illustrating a method of counting the number of memory cells in a nonvolatile memory device according to example embodiments. The descriptions repeated with FIGS. 1 and 18 will be omitted.

Referring to FIG. 23, in a method of counting the number of memory cells in a nonvolatile memory device according to example embodiments, steps S2100 and S2200 may be substantially the same as steps S1100 and S1200 in FIG. 18, respectively.

Steps S2300 and S2500 may be similar to step S1300 in FIG. 18, steps S2400 and S2600 may be similar to step S1400 in FIG. 18, and step S2700 may be similar to step S1500 in FIG. 18. For example, after the first shifting operation in step S2300 and during the second sensing operation in step S2400, the measurement range and the plurality of measurement intervals may have a fifth range and the plurality of fifth intervals, respectively. After a second shifting operation in step S2500 and during a third sensing operation in step S2600, the measurement range and the plurality of measurement intervals may have a sixth range and the plurality of sixth intervals, respectively. A width of the fifth range and a width of the sixth range may be equal to the width of the third range, and a width of each of the plurality of fifth intervals and a width of each of the plurality of sixth intervals may be equal to the width of each of the plurality of third intervals.

In the method of counting the number of memory cells in the nonvolatile memory device according to example embodiments, three sensing operations may be performed by changing the measurement position of the measurement window on time, and the final count value may be obtained by combining the results of the three sensing operations. Thus, the cell count value with a relatively improved resolution and a relatively improved capacity may be obtained by performing additional sensing operations with a relatively short time.

Figure 24A:
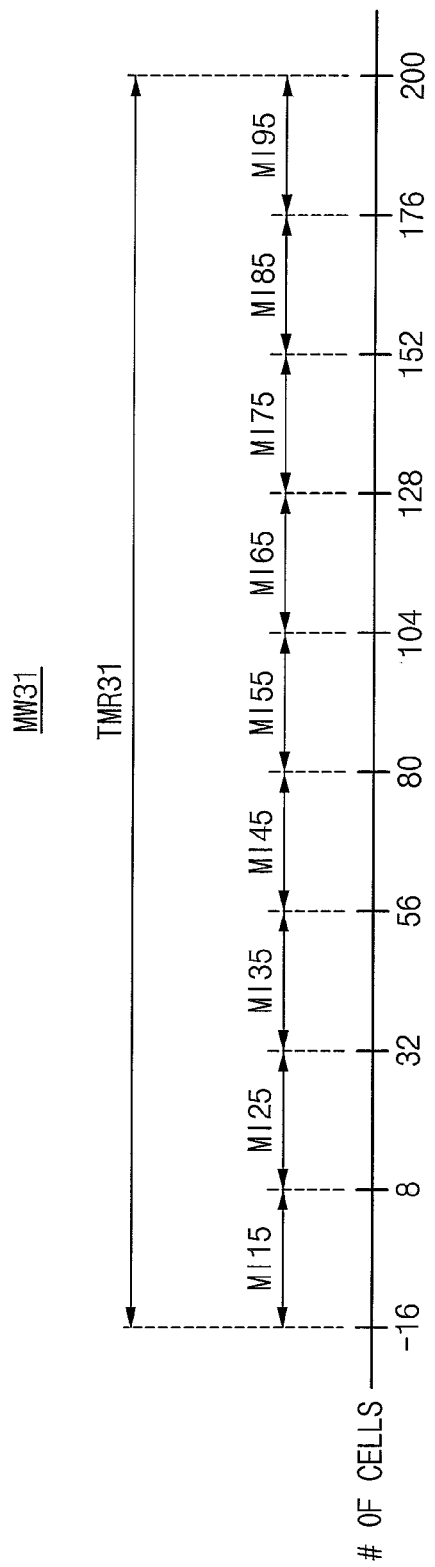

FIGS. 24A and 24B are diagrams for describing an example of performing a first shifting operation in FIG. 23 according to example embodiments. The descriptions repeated with FIGS. 13, 14A, 14B, 21A and 21B will be omitted.

Referring to FIGS. 24A and 24B, the first shifting operation of step S2300 in FIG. 23 may be similar to step S1300 in FIG. 18. For example, step S2300 may be performed by activating the enable signal EN0 and by deactivating the enable signals EN1, EN2 and EN3.

In some example embodiments, when the first shifting operation of step S2300 is performed, the measurement range and the plurality of measurement intervals may be set to the fifth range and the plurality of fifth intervals, respectively. For example, a measurement window MW31 may be shifted as illustrated in FIG. 24A. The measurement window MW31 may have a measurement range TMR31 and a plurality of measurement intervals MI15, MI25, MI35, MI45, MI55, MI65, MI75, MI85 and MI95. For example, a width of the measurement range TMR31 may be two hundreds sixteen that is equal to the width of the measurement range TMR21 in FIG. 20A, and a width of each measurement interval may be twenty four that is equal to the width of each measurement interval in FIG. 20A. Measurement intervals and cell count values depending on the digital values OUT<0:9> output from the analog-to-digital converter 600 may be implemented as illustrated in FIG. 24B.

In some example embodiments, the boundary values of the measurement intervals MI13 through MI93 in FIG. 20A and boundary values of the measurement intervals MI15 through MI95 in FIG. 24A may not overlap each other, and the boundary values of the measurement intervals MI15 through MI95 may be located to the left of the center values of the measurement intervals MI13 through MI93. For example, the measurement window MW31 may be shifted such that the boundary values are located at one third (e.g., ⅓) of the measurement intervals MI13 through MI93.

Figure 25A:
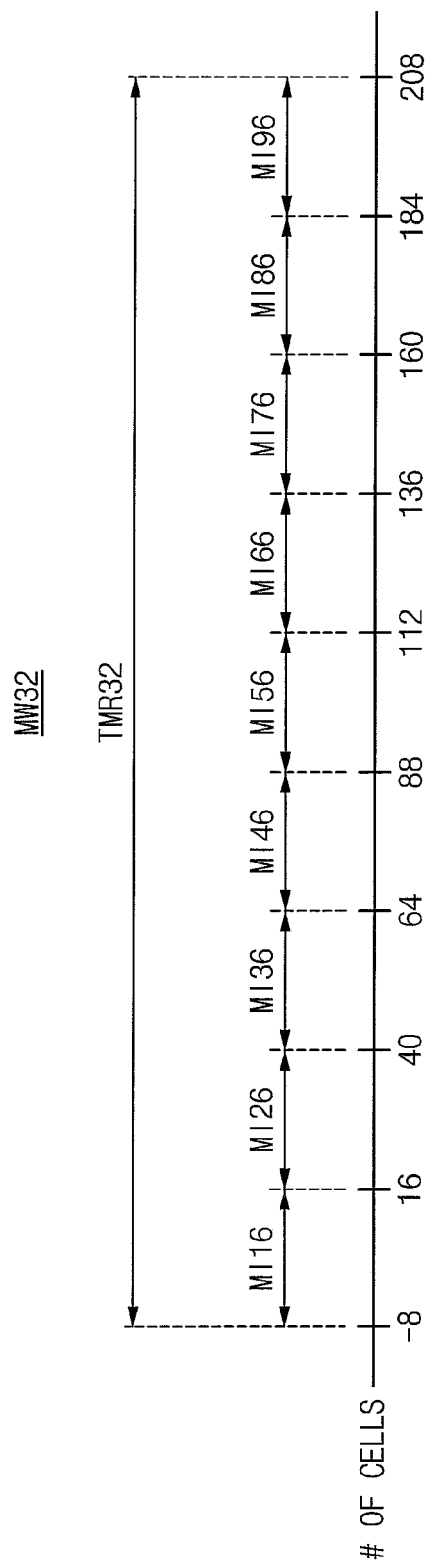

FIGS. 25A and 25B are diagrams for describing an example of performing a second shifting operation in FIG. 23 according to example embodiments. The descriptions repeated with FIGS. 13, 14A, 14B, 21A and 21B will be omitted.

Referring to FIGS. 25A and 25B, the second shifting operation of step S2500 in FIG. 23 may be similar to step S1300 in FIG. 18. For example, step S2500 may be performed by activating the enable signals EN1, EN2 and EN3 and by deactivating the enable signal EN0.

In some example embodiments, when the second shifting operation of step S2500 is performed, the measurement range and the plurality of measurement intervals may be set to the sixth range and the plurality of sixth intervals, respectively. For example, a measurement window MW32 may be shifted as illustrated in FIG. 25A. The measurement window MW32 may have a measurement range TMR32 and a plurality of measurement intervals MI16, MI26, MI36, MI46, MI56, MI66, MI76, MI86 and MI96. For example, a width of the measurement range TMR32 may be two hundreds sixteen that is equal to the width of the measurement range TMR21 in FIG. 20A, and a width of each measurement interval may be twenty four that is equal to the width of each measurement interval in FIG. 20A. Measurement intervals and cell count values depending on the digital values OUT<0:9> output from the analog-to-digital converter 600 may be implemented as illustrated in FIG. 25B.

In some example embodiments, the boundary values of the measurement intervals MI13 through MI93 in FIG. 20A and boundary values of the measurement intervals MI16 through MI96 in FIG. 25A may not overlap each other, and the boundary values of the measurement intervals MI16 through MI96 may be located to the right of the center values of the measurement intervals MI13 through MI93. For example, the measurement window MW32 may be shifted such that the boundary values are located at two thirds (e.g., ⅓) of the measurement intervals MI13 through MI93.

Figure 26A:
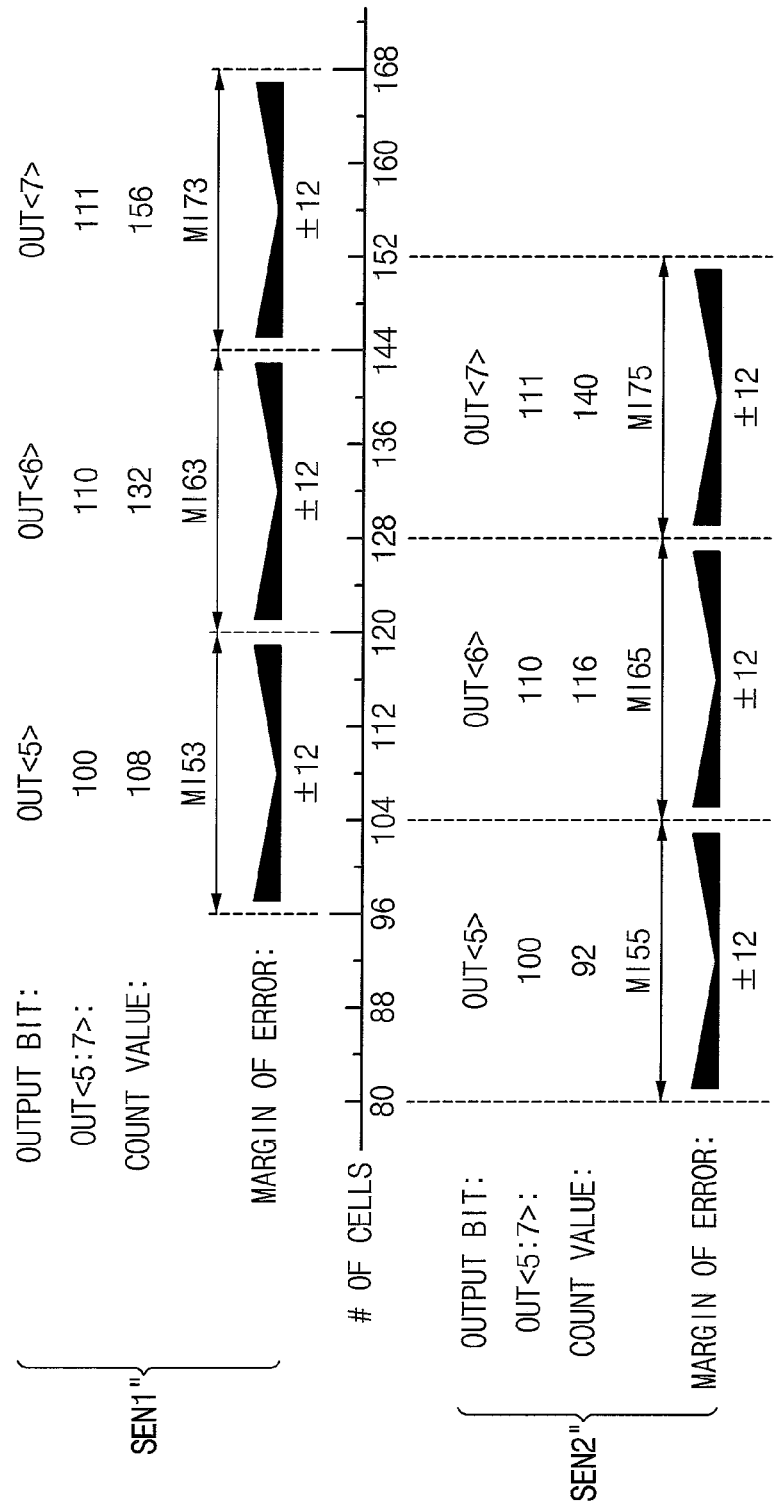

FIGS. 26A and 26B are diagrams for describing an example of obtaining a final count value in FIG. 23 according to example embodiments. The descriptions repeated with FIGS. 12, 16, 17 and 22 will be omitted.

Referring to FIGS. 26A and 26B, a final count result FCNT" for the first memory cells may be obtained based on a result SEN1" of the first sensing operation performed by step S2200 in FIG. 23, a result SEN2" of the second sensing operation performed by step S2400 in FIG. 23 and a result SEN3" of the third sensing operation performed by step S2600 in FIG. 23.

The result SEN1" of the first sensing operation may be similar to the result SEN1' of the first sensing operation in FIG. 22, the results SEN2" and SEN3" of the second and third sensing operations may be similar to the result SEN2' of the second sensing operation in FIG. 22, and a margin of error of each of the first, second, and third count values may be ±12. When the first digital value OUT<5:7>_SEN1, the second digital value OUT<5:7>_SEN2 and the third digital value OUT<5:7>_SEN3 are '000', '100' and '000', respectively, it may represent that the first count value, the second count value and the third count value are eighty four, ninety two and seventy six, respectively, and thus the final count value may be obtained as eighty four. Similarly, when the first digital value OUT<5:7>_SEN1 is '000', '100', '100', '100', '110', '110', '110' and '111', when the second digital value OUT<5:7>_SEN2 is '100', '100', '110', '110', '110', '111', '111' and '111', and when the third digital value OUT<5:7>_SEN3 is '100', '100', '100', '110', '110', '110', '111' and '111', the final count value may be obtained as a respective one of ninety two, one hundred, one hundred eight, one hundred sixteen, one hundred twenty four, one hundred thirty two, one hundred forty and one hundred forty eight. A margin of error of the final count value may be ±4. As compared with the result SEN1" of the first sensing operation, the margin of error may be reduced in the final count result FCNT" by one third for the same measurement range. Thus, as compared with the count result based on the initial setting operation (e.g., as compared with the example of FIG. 12), the resolution may be increased in the final count result FCNT" and the capacity may be doubled in the final count result FCNT" (e.g., the measurement interval may be reduced to eight and the measurement range may be increased to two hundreds sixteen).

Although example embodiments are described based on the measurement windows having a specific size and location, a specific number of memory cells and a specific number of enable signals, the invention is not limited thereto. In addition, example embodiments may be extended to an example where the final count value is obtained based on performing three or more shifting operations and four or more sensing operations.

Figure 27:
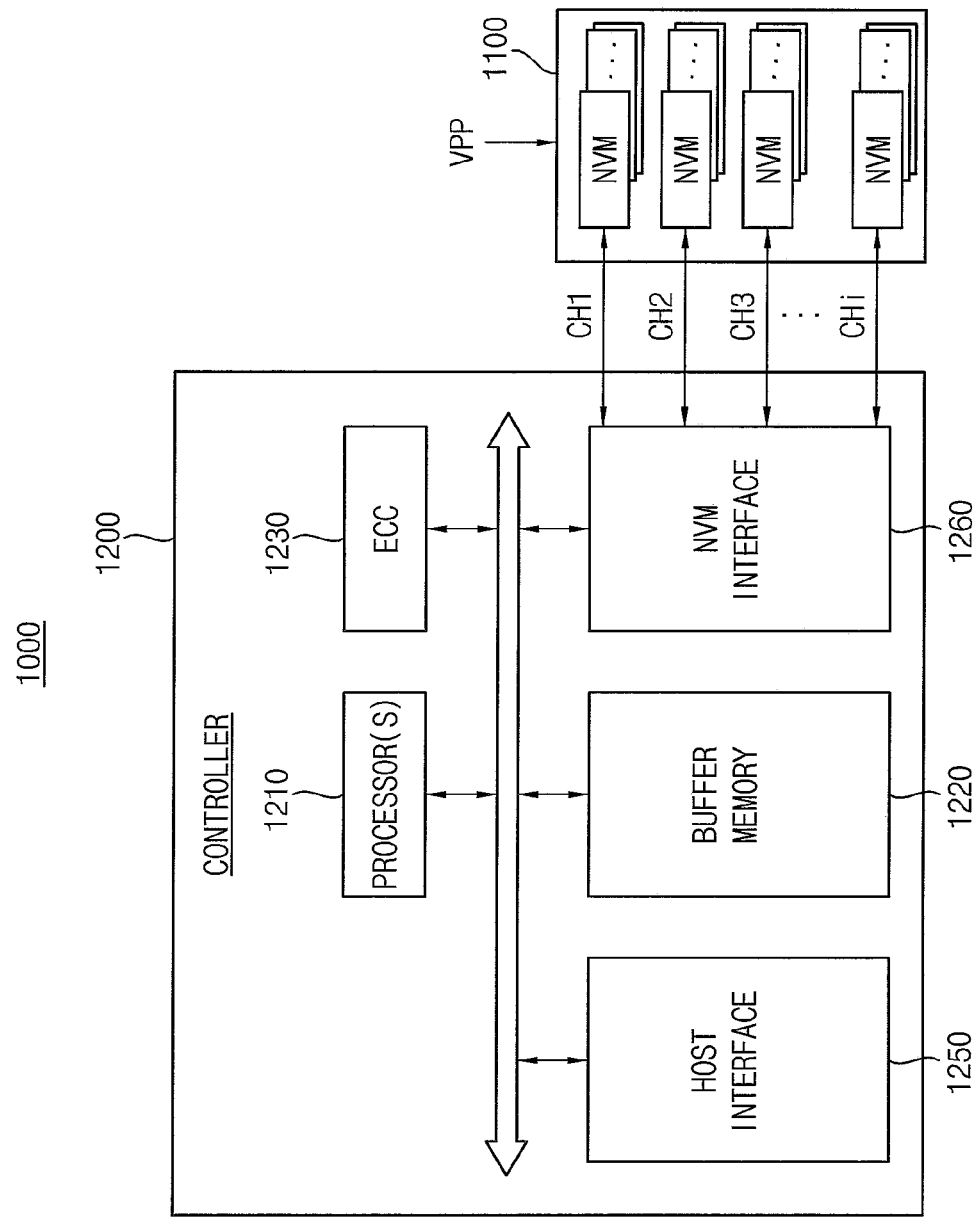
FIG. 27 is a block diagram illustrating a storage device that includes a nonvolatile memory device according to example embodiments.

FIG. 27 is a block diagram illustrating a storage device that includes a nonvolatile memory device according to example embodiments.

Referring to FIG. 27, a storage device 1000 may include a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3 . . . , and CHi. The controller 1200 may include one or more processors 1210, a buffer memory 1220, an error correction code (ECC) circuit 1230, a host interface 1250 and a nonvolatile memory interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may correspond to the nonvolatile memory device 100 of FIG. 2 according to example embodiments, and may be optionally supplied with an external high voltage VPP.

Figure 28:
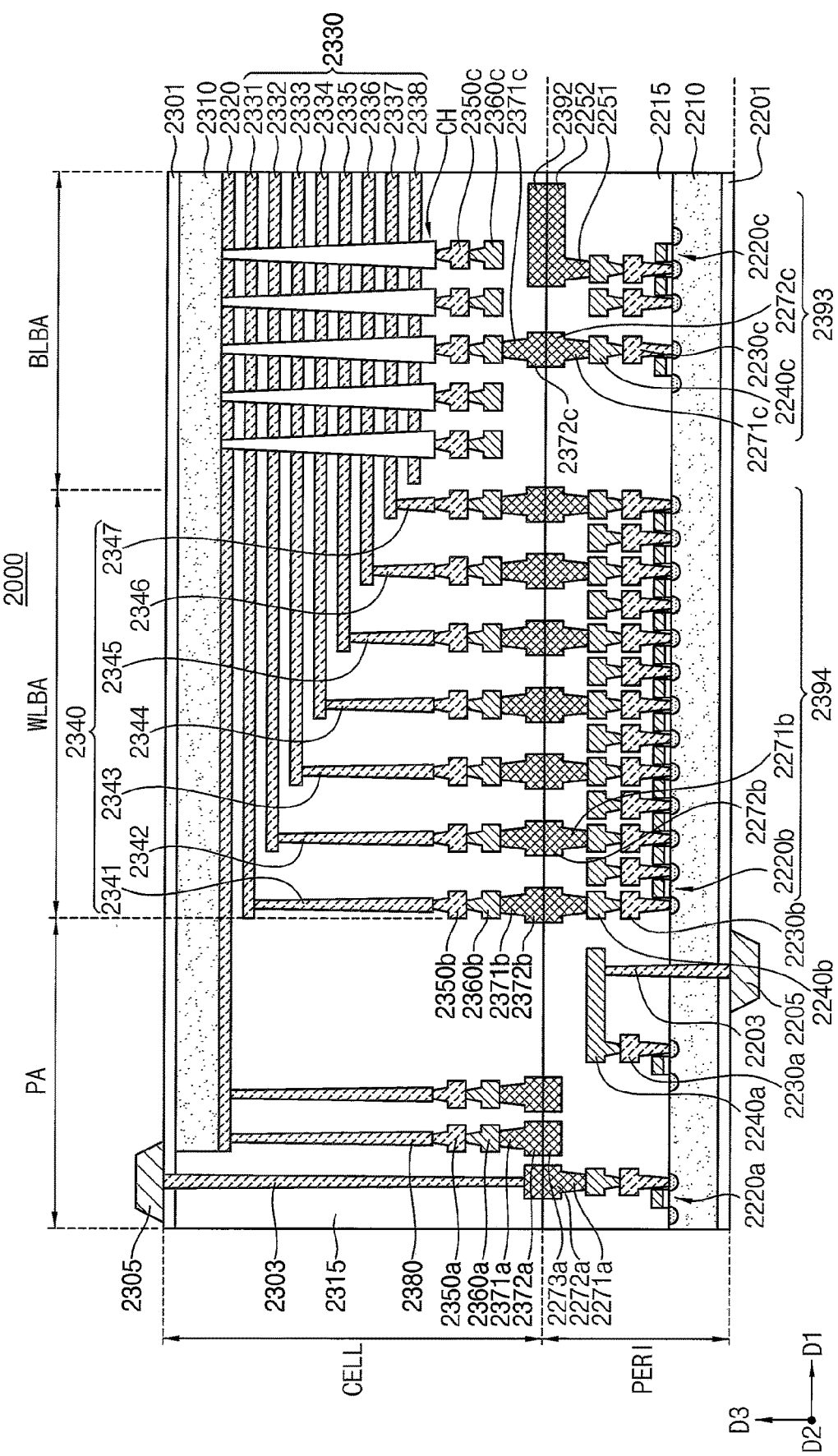
FIG. 28 is a cross-sectional view of a nonvolatile memory device according to example embodiments.

FIG. 28 is a cross-sectional view of a nonvolatile memory device according to example embodiments.

Referring to FIG. 28, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. Each of the circuit elements 2220a, 2220b, and 2220c may include one or more transistors. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 28, although only the first metal layers 2230a, 2230b, and 2230c and the second metal layers 2240a, 2240b, and 2240c are shown and described, the invention is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like.

The upper bonding metals 2371b and 2372b in the cell region CELL may be referred as first metal pads and the lower bonding metals 2271b and 2272b in the peripheral circuit region PERI may be referred as second metal pads. Further, the first metal pads and the second metal pads may be connected to each other in a bonding manner.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (i.e., 2330) may be stacked in a third direction D3 (e.g., a Z-axis direction), perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a second direction D2 (e.g., a Y-axis direction), parallel to the upper surface of the second substrate 2310.

In an example embodiment illustrated in FIG. 28, an area in which the channel structure CH, the bitline 2360c, and the like are disposed may be defined as the bitline bonding area BLBA. In the bitline bonding area BLBA, the bitline 2360c may be electrically connected to the circuit elements 2220c providing a page buffer 2393 in the peripheral circuit region PERI. The bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the wordline bonding area WLBA, the plurality of wordlines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (i.e., 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350b and a second metal layer 2360b may be connected to an upper portion of the plurality of cell contact plugs 2340 connected to the plurality of wordlines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the wordline bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to embodiments, the second substrate 2310 and the common source line 2320 may not be disposed in an area in which the second input/output contact plug 2303 is disposed. Also, the second input/output pad 2305 may not overlap the wordlines 2330 in the third direction D3 (e.g., the Z-axis direction). The second input/output contact plug 2303 may be separated from the second substrate 2310 in the direction, parallel to the upper surface of the second substrate 2310, and may pass through an interlayer insulating layer 2315 of the cell region CELL to be connected to the second input/output pad 2305 and an upper metal pattern 2372a of the cell region CELL.

According to embodiments, the first input/output pad 2205 and the second input/output pad 2305 may be selectively formed. For example, the memory device 2000 may include only the first input/output pad 2205 disposed on the lower insulating film 2201 in contact with the first substrate 2210 or the second input/output pad 2305 disposed on the upper insulating film 2301 in contact with the second substrate 2310. Alternatively, the memory device 2000 may include both the first input/output pad 2205 and the second input/output pad 2305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 2000 may include a lower metal pattern 2273a, corresponding to the upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bitline bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The method according to example embodiments disclosed herein may be applied or employed to the memory device 2000, and the memory device 2000 may be implemented to perform the method according to example embodiments disclosed herein.

In an example embodiment, the nonvolatile memory device 2000, such as described in FIG. 28, can operate and can include device components according to one or more of the example embodiments described in FIGS. 1 to 4, 6, 7A, 7B, 8A, 8B, 9, 10A, 10B, 11 to 13, 14A, 14B, 15 to 19, 20A, 20B, 21A, 21B, 22, 23, 24A, 24B, 25A, 25B, 26A, 26B and 27, previously.

The disclosure of the invention may be applied to various devices and systems that include the nonvolatile memory devices. For example, the invention may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of counting a number of memory cells in a memory cell array of a nonvolatile memory device, the method comprising:
   receiving an analog signal at an analog-to-digital converter of the nonvolatile memory device;
   setting a measurement range and a plurality of measurement intervals of a measurement window for a cell counting operation to a first range and a plurality of first intervals, respectively, the plurality of measurement intervals being included in the measurement range;
   performing a first sensing operation on first memory cells included in a first region of the memory cell array based on the measurement window;

performing a first shifting operation for shifting the measurement window while a width of the measurement range and a width of each of the plurality of measurement intervals are maintained;

performing a second sensing operation on the first memory cells based on the measurement window shifted by the first shifting operation; and obtaining a final count value for the first memory cells based on a result of the first sensing operation and a result of the second sensing operation, wherein the measurement range and each of the plurality of measurement intervals represent a number of memory cells associated with the final count value, wherein the measurement window is determined by the analog-to-digital convener induct a plurality of transistors, and wherein the first shifting operation is performed by controlling turn-on and turn-off of at least some of the plurality of transistors without changing the analog signal applied to the analog-to-digital converter.

2. The method of claim 1, wherein:

during the first sensing operation, the measurement range and the plurality of measurement intervals have the first range and the plurality of first intervals, respectively, after the first shifting operation and during the second sensing operation, the measurement range and the plurality of measurement intervals have a second range and a plurality of second intervals, respectively, a width of the second range is equal to a width of the first range, and a width of each of the plurality of second intervals is equal to a width of each of the plurality of first intervals, and boundary values of the plurality of first intervals and boundary values of the plurality of second intervals do not overlap each other.

3. The method of claim 2, wherein the boundary values of the plurality of second intervals correspond to center values of the plurality of first intervals.

4. The method of claim 1, wherein the analog signal is a reference voltage having a specific voltage level.

5. The method of claim 1, wherein the performing of the first sensing operation includes:

obtaining a first sensing current from the first memory cells;

obtaining a first digital value by comparing the first sensing current to a reference current based on the measurement window;

obtaining a first count value based on the first digital value; and storing at least one of the first digital value and the first count value.

6. The method of claim 1, further comprising:

changing the measurement range and the plurality of measurement intervals into a second range and a plurality of second intervals, respectively, wherein a width of the second range is wider than a width of the first range, and wherein a width of each of the plurality of second intervals is wider than a width of each of the plurality of first intervals.

7. The method of claim 6, wherein the width of the second range is twice the width of the first range, and wherein the width of each of the plurality of second intervals is twice the width of each of the plurality of first intervals.

8. The method of claim 6, wherein:

during the first sensing operation, the measurement range and the plurality of measurement intervals have the second range and the plurality of second intervals, respectively, after the first shifting operation and during the second sensing operation, the measurement range and the plurality of measurement intervals have a third range and a plurality of third intervals, respectively, a width of the third range is equal to the width of the second range, and a width of each of the plurality of third intervals is equal to the width of each of the plurality of second intervals, and boundary values of the plurality of second intervals and boundary values of the plurality of third intervals do not overlap each other.

9. The method of claim 8, wherein the boundary values of the plurality of third intervals correspond to center values of the plurality of second intervals.

10. The method of claim 6, further comprising:

performing a second shifting operation for shifting the measurement window while the width of the second range and the width of each of the plurality of second intervals are maintained; and performing a third sensing operation on the first memory cells based on the measurement window shifted by the second shifting operation, wherein the final count value is obtained based on the result of the first sensing operation, the result of the second sensing operation and a result of the third sensing operation.

11. The method of claim 10, wherein:

during the first sensing operation, the measurement range and the plurality of measurement intervals have the second range and the plurality of second intervals, respectively, after the first shifting operation and during the second sensing operation, the measurement range and the plurality of measurement intervals have a third range and a plurality of third intervals, respectively, after the second shifting operation and during the third sensing operation, the measurement range and the plurality of measurement intervals have a fourth range and a plurality of fourth intervals, respectively, a width of the third range and a width of the fourth range are equal to the width of the second range, and a width of each of the plurality of third intervals and a width of each of the plurality of fourth intervals are equal to the width of each of the plurality of second intervals, and boundary values of the plurality of second intervals, boundary values of the plurality of third intervals and boundary values of the plurality of fourth intervals do not overlap each other.

12. The method of claim 11, wherein the boundary values of the plurality of third intervals are located to left of center values of the plurality of second intervals, and the boundary values of the plurality of fourth intervals are located to right of the center values of the plurality of second intervals.

13. A nonvolatile memory device comprising:

a memory cell array including a plurality of memory cells; and a control circuit configured to:

set a measurement range and a plurality of measurement intervals of a measurement window for a cell counting operation to a first range and a plurality of first intervals, respectively, perform a first sensing operation on first memory cells included in a first region of the memory cell array based on the measurement window, perform a first shifting operation for shifting the measurement window while a width of the measurement range and a width of each of the plurality of measurement intervals are maintained, perform a second sensing operation on the first memory cells based on the measurement window shifted by the first shifting operation, and obtain a final count value for the first memory cells based on a result of the first sensing operation and a result of the second sensing operation, wherein the plurality of measurement intervals are included in the measurement range, and wherein the control circuit includes:

an analog-to-digital converter configured to perform an operation of setting the measurement window, the first sensing operation, the first shifting operation and the second sensing operation based on a sensing current obtained from the first memory cells, a reference voltage and a plurality of enable signals;

a storage configured to store the result of the first sensing operation and the result of the second sensing operation;

a calculator configured to generate the final count value based on the result of the first sensing operation and the result of the second sensing operation, wherein the first shifting operation is performed based on the plurality of enable signals without changing the reference voltage.

14. The nonvolatile memory device of claim 13, wherein the analog-to-digital converter includes:

a first circuit configured to generate a reference current based on the reference voltage;

a second circuit connected to the first circuit, and configured to receive the sensing current;

a third circuit connected to the second circuit, and configured to generate a plurality of digital bits representing the result of the first sensing operation and the result of the second sensing operation; and a fourth circuit connected to the second circuit and the third circuit, and including a plurality of transistors that are selectively turned on and off based on the plurality of enable signals.

15. The nonvolatile memory device of claim 13, wherein:

the control circuit is configured to change the measurement range and the plurality of measurement intervals into a second range and a plurality of second intervals, respectively, a width of the second range is wider than a width of the first range, and a width of each of the plurality of second intervals is wider than a width of each of the plurality of first intervals, during the first sensing operation, the measurement range and the plurality of measurement intervals have the second range and the plurality of second intervals, respectively, after the first shifting operation and during the second sensing operation, the measurement range and the plurality of measurement intervals have a third range and a plurality of third intervals, respectively, a width of the third range is equal to the width of the second range, and a width of each of the plurality of third intervals is equal to the width of each of the plurality of second intervals, and boundary values of the plurality of second intervals and boundary values of the plurality of third intervals do not overlap each other.

16. The nonvolatile memory device of claim 15, wherein:

the control circuit is configured to further perform a second shifting operation for shifting the measurement window while the width of the measurement range and the width of each of the plurality of measurement intervals are maintained, and to further perform a third sensing operation on the first memory cells based on the measurement window shifted by the second shifting operation, the final count value is obtained based on the result of the first sensing operation, the result of the second sensing operation and a result of the third sensing operation, after the second shifting operation and during the third sensing operation, the measurement range and the plurality of measurement intervals have a fourth range and a plurality of fourth intervals, respectively, a width of the fourth range is equal to the width of the second range, and a width of each of the plurality of fourth intervals is equal to the width of each of the plurality of second intervals, and the boundary values of the plurality of second intervals, the boundary values of the plurality of third intervals and boundary values of the plurality of fourth intervals do not overlap each other.

17. The nonvolatile memory device of claim 13, wherein the nonvolatile memory device has a chip-to-chip (C2C) structure in which a first chip including the memory cell array is manufactured, a second chip including the control circuit is manufactured, and the first chip and the second chip are bonded to each other.

18. A method of counting a number of memory cells in a memory cell array of a nonvolatile memory device, the method comprising:

setting a measurement range and a plurality of measurement intervals of a measurement window for a cell counting operation to a first range and a plurality of first intervals, respectively, the plurality of measurement intervals being included in the measurement range;

performing a first sensing operation on first memory cells included in a first region of the memory cell array based on the measurement window having the first range and the plurality of first intervals;

performing a first shifting operation for shifting the measurement window while a width of the measurement range and a width of each of the plurality of measurement intervals are maintained, the measurement range being set to a second range having a width equal to that of the first range by the first shifting operation, the plurality of measurement intervals being set to a plurality of second intervals having a width equal to that of each of the plurality of first intervals by the first shifting operation;

performing a second sensing operation on the first memory cells based on the measurement window shifted by the first shifting operation and having the second range and the plurality of second intervals; and obtaining a final count value for the first memory cells based on a result of the first sensing operation and a result of the second sensing operation, wherein the performing of the first sensing operation includes:
  obtaining a first sensing current from the first memory cells;
  obtaining a first count value by comparing the first sensing current with a reference current; and
  storing the first count value,
wherein the performing of the second sensing operation includes:
  obtaining a second sensing current from the first memory cells;
  obtaining a second count value by comparing the second sensing current with the reference current; and
  storing the second count value, and
wherein the obtaining of the final count value includes calculating the final count value based on the first count value and the second count value.

* * * * *